US010032745B2

(12) United States Patent
Miyaki et al.

(10) Patent No.: US 10,032,745 B2
(45) Date of Patent: Jul. 24, 2018

(54) METHOD OF MANUFACTURING SEMICONDUCTOR DEVICE

(71) Applicant: Renesas Electronics Corporation, Kawasaki-shi, Kanagawa (JP)

(72) Inventors: Yoshinori Miyaki, Kanagawa (JP); Masaru Yamada, Kanagawa (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 14/341,793

(22) Filed: Jul. 26, 2014

(65) Prior Publication Data
US 2015/0031191 A1 Jan. 29, 2015

(30) Foreign Application Priority Data

Jul. 26, 2013 (JP) .................................. 2013-155546

(51) Int. Cl.
*H01L 23/00* (2006.01)
*H01L 23/544* (2006.01)
(Continued)

(52) U.S. Cl.
CPC ............ *H01L 24/97* (2013.01); *H01L 23/544* (2013.01); *H01L 21/6836* (2013.01); *H01L 21/78* (2013.01);
(Continued)

(58) Field of Classification Search
CPC .......... H01L 21/78; H01L 2223/54426; H01L 2223/55453; H01L 2223/5446;
(Continued)

(56) References Cited

U.S. PATENT DOCUMENTS 6,219,912 B1  4/2001 Shimizu et al.
6,303,470 B1 * 10/2001 Ohsumi ................ H01L 23/544
                                                              257/E21.508
(Continued)

FOREIGN PATENT DOCUMENTS

CN  1577798 A  2/2005
JP  2-42466 U  3/1990
(Continued)

OTHER PUBLICATIONS

English Tranlation of JP 2008-034681.*
(Continued)

*Primary Examiner* — Mary Wilczewski
*Assistant Examiner* — Erik T Peterson
(74) *Attorney, Agent, or Firm* — Shapiro, Gabor and Rosenberger, PLLC

(57) ABSTRACT

To enhance reliability in assembling a semiconductor device. There is provided a wiring substrate including a target mark, which is not provided on an extension line of a dicing region provided between a first semiconductor device region and a second semiconductor device region but is provided between the extension line of the dicing region and a first imaginary extension line of a first outermost peripheral land row and between the extension line of the dicing region and a second imaginary extension line of a second outermost peripheral land row. Furthermore, after mounting a semiconductor chip, wire bonding is performed, resin sealing is performed and a solder ball is mounted. After that, the dicing region is specified on the basis of the target mark, and the wiring substrate is cut along the dicing region.

8 Claims, 30 Drawing Sheets

(51) Int. Cl.
*H01L 21/78* (2006.01)
*H01L 21/683* (2006.01)

(52) U.S. Cl.
CPC ........... *H01L 2221/68327* (2013.01); *H01L 2223/54406* (2013.01); *H01L 2223/54426* (2013.01); *H01L 2223/54433* (2013.01); *H01L 2223/54486* (2013.01); *H01L 2224/05554* (2013.01); *H01L 2224/32225* (2013.01); *H01L 2224/45144* (2013.01); *H01L 2224/48091* (2013.01); *H01L 2224/48227* (2013.01); *H01L 2224/48228* (2013.01); *H01L 2224/48465* (2013.01); *H01L 2224/49171* (2013.01); *H01L 2224/73265* (2013.01); *H01L 2224/92247* (2013.01); *H01L 2224/97* (2013.01); *H01L 2924/12042* (2013.01); *H01L 2924/15183* (2013.01); *H01L 2924/15311* (2013.01); *H01L 2924/181* (2013.01)

(58) Field of Classification Search
CPC ... H01L 2223/5448; H01L 2224/24137; H01L 2224/81121; H01L 2224/8113; H01L 2224/83121; H01L 2224/8314; H01L 23/544; H01L 24/94; H01L 24/97; H01L 2223/54486; Y10S 438/975

See application file for complete search history.

(56) References Cited

U.S. PATENT DOCUMENTS

| | | | |
|---|---|---|---|
| 7,081,374 B2 | 7/2006 | Yamaguchi | |
| 2002/0058396 A1* | 5/2002 | Roberts | H01L 23/544 |
| | | | 438/460 |
| 2005/0208735 A1* | 9/2005 | Noma | H01L 21/561 |
| | | | 438/460 |
| 2009/0102071 A1* | 4/2009 | Kindo | H01L 23/544 |
| | | | 257/797 |
| 2009/0243044 A1* | 10/2009 | Tanaka et al. | 257/618 |
| 2010/0258932 A1* | 10/2010 | Yoshida | H01L 21/561 |
| | | | 257/686 |

FOREIGN PATENT DOCUMENTS

| | | |
|---|---|---|
| JP | 11-186439 A | 7/1999 |
| JP | 2003-101187 A | 4/2003 |
| JP | 2005-032910 A | 2/2005 |
| JP | 2006-134902 A | 5/2006 |
| JP | 2008-034681 A | 2/2008 |
| JP | 2011-211159 A | 10/2011 |

OTHER PUBLICATIONS

Machine translation for Takahashi, JP2008-034681A, Feb. 14, 2008, obtained from JPO's AIPN on Apr. 10, 2017.*
Machine translation for Kono et al., JP2003-101187A, Apr. 4, 2003, obtained from JPO'S AIPN on Apr. 10, 2017.*
Office Action dated Dec. 27, 2016, in Japanese Patent Application No. 2013-155546.
Office Action dated Nov. 3, 2017, in Chinese Patent Application No. 201410361182.5.

* cited by examiner

METHOD OF MANUFACTURING SEMICONDUCTOR DEVICE

CROSS-REFERENCE TO RELATED APPLICATION

The disclosure of Japanese Patent Application No. 2013-155546 filed on Jul. 26, 2013 including the specification, drawings and abstract is incorporated herein by reference in its entirety.

BACKGROUND

The present invention relates to a technology of manufacturing a semiconductor device, and, for example, relates to the assembling of a semiconductor device including a wiring substrate on which a target mark is formed in the peripheral part thereof.

In Japanese Patent Laid-Open No. 2008-34681 (Patent Literature 1), there is described a technology that relates to a wiring substrate (multi-piece substrate) on which a target mark (target pattern) is formed on an extension line of each dicing region (scribing region, cutting region) in the peripheral part (part positioned around a plurality of device areas) thereof (for example, see FIGS. 16 and 18 of Patent Literature 1).

PATENT LITERATURE

[Patent Literature 1] Japanese Patent Laid-Open No. 2008-34681

According to the examination by the present inventors, as shown in, for example, FIG. 18 in Patent Literature 1, the target mark (at least a part of the target mark) exists on the extension line of the dicing region of the wiring substrate. Furthermore, it has been known that, when a dicing blade (rotatable cutting blade) used in a cutting process (dicing process) of the wiring substrate is worn away, a foreign substance (trash) 43 formed of a part of a target mark 42 is generated as shown in FIGS. 34 to 36 of the present application.

SUMMARY

Meanwhile, since the generation of the foreign substance 43 is a factor of lowering the reliability of the semiconductor device, the generation of the foreign substance 43 is required to be suppressed.

The other objects and the new feature will become clear from the description of the present specification and the accompanying drawings.

In the method of manufacturing a semiconductor device according to one embodiment, there is provided a wiring substrate which includes a first device region and a second device region provided on the lower surface, a dicing region provided between the first device region and the second device region, and a target mark that is not provided on an extension line of the dicing region but is provided between an extension line of the dicing region and an extension line of a first outermost peripheral bump land row. Furthermore, in the method of manufacturing a semiconductor device, a first semiconductor chip is mounted in a first upper surface side device area, a second semiconductor chip is mounted in a second upper surface side device area, and after that, the first semiconductor chip and the second semiconductor chip are sealed with resin. In addition, in the method of manufacturing a semiconductor device, after forming a plurality of first external terminals and a plurality of second external terminals, respectively, on the first bump lands and the second bump lands, the dicing region is specified on the basis of the target mark, and the wiring substrate is cut along the dicing region by using a dicing blade.

According to the above-described embodiment, the enhancement of reliability in assembling a semiconductor device can be achieved.

DETAILED DESCRIPTION

In embodiments below, except when particularly necessary, the explanation of the identical or similar parts is not repeated as a principle.

Furthermore, the following embodiment will be explained, divided into plural sections or embodiments, if necessary for convenience. Except for the case where it shows clearly in particular, they are not unrelated mutually and one has relationships such as a modification, details, and supplementary explanation of some or entire of another.

In the following embodiment, when referring to the number of elements, and the like (including the number, a numeric value, an amount, a range, and the like), they may be not restricted to the specific number but may be greater or smaller than the specific number, except for the case where they are clearly specified in particular and where they are clearly restricted to a specific number theoretically.

In the following embodiment, it is needless to say that an element (including an element step and the like) is not necessarily indispensable, except for the case where it is clearly specified in particular, where it is considered to be clearly indispensable from a theoretical point of view, and the like.

In the following embodiment, it is needless to say that, when referred to as "formed of A," "made from A," "having A", "containing A" about a constituent component or the like, other constituent components are not excluded, except for the case where it is clearly specified in particular to be the constituent component alone. Similarly, in the following embodiment, when shape, position relationship, or the like of a constituent component or the like is referred to, what resembles or is similar to the shape substantially shall be included, except for the case where it is clearly specified in particular and where it is considered to be clearly not right from a theoretical point of view. This statement also applies to the numeric value and range described above.

Hereinafter, the embodiment of the present invention will be explained on the basis of the drawings. Meanwhile, in all the drawings for explaining the embodiment, the same symbol is attached to members having the same function, and the repeated explanation thereof is omitted. In order to make a drawing intelligible, hatching may be attached even if it is a plan view.

(Embodiment)

<Semiconductor Device>

Figure 1:
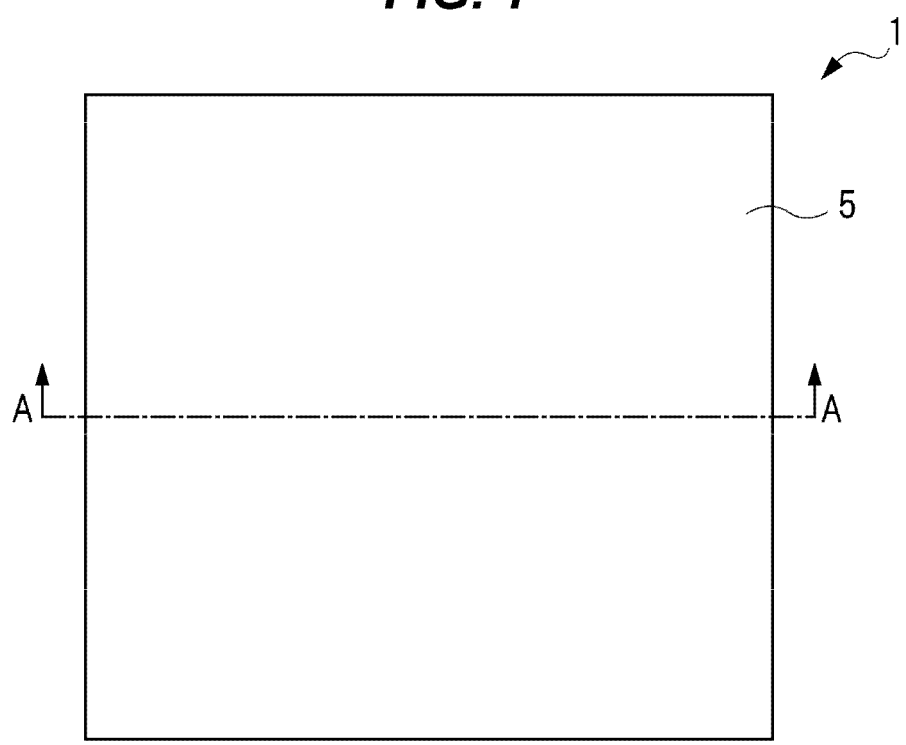
FIG. 1 is a plan view showing an example of the structure of a semiconductor device of an embodiment.
Figure 2:
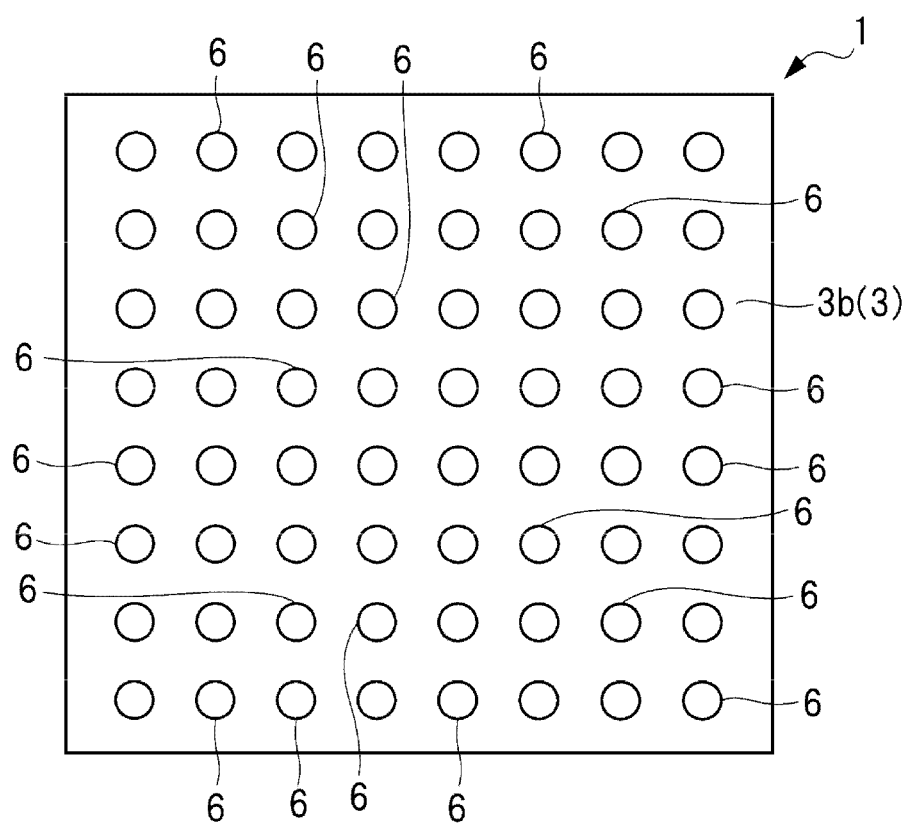
FIG. 2 is a rear view showing an example of the structure of the semiconductor device in FIG. 1.
Figure 3:
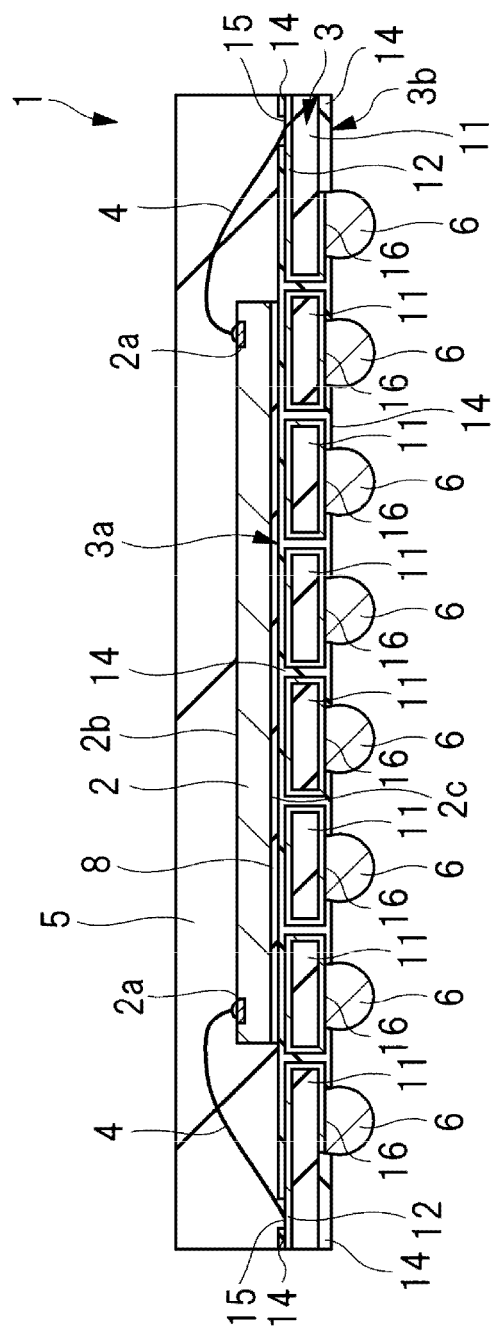
FIG. 3 is a cross-sectional view showing an example of the structure of the semiconductor device in FIG. 1.
Figure 4:
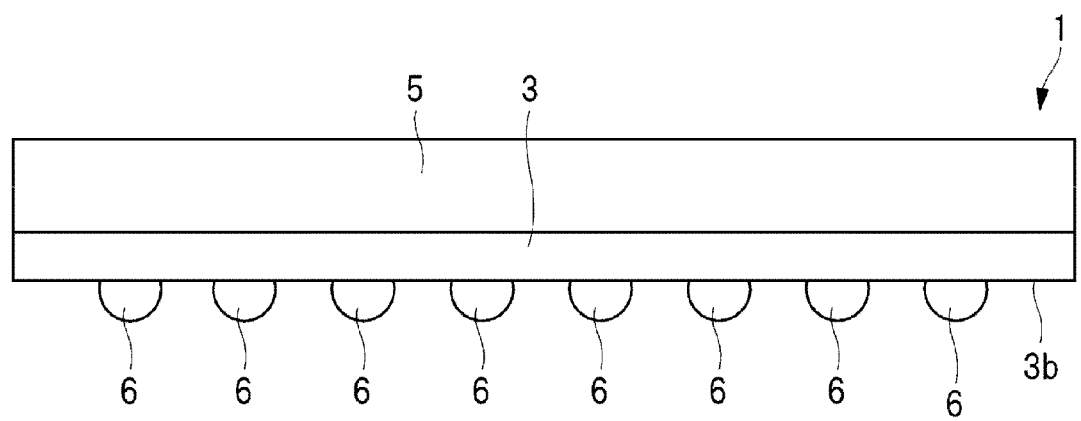
FIG. 4 is a side view showing an example of the structure of the semiconductor device in FIG. 1.
Figure 5:
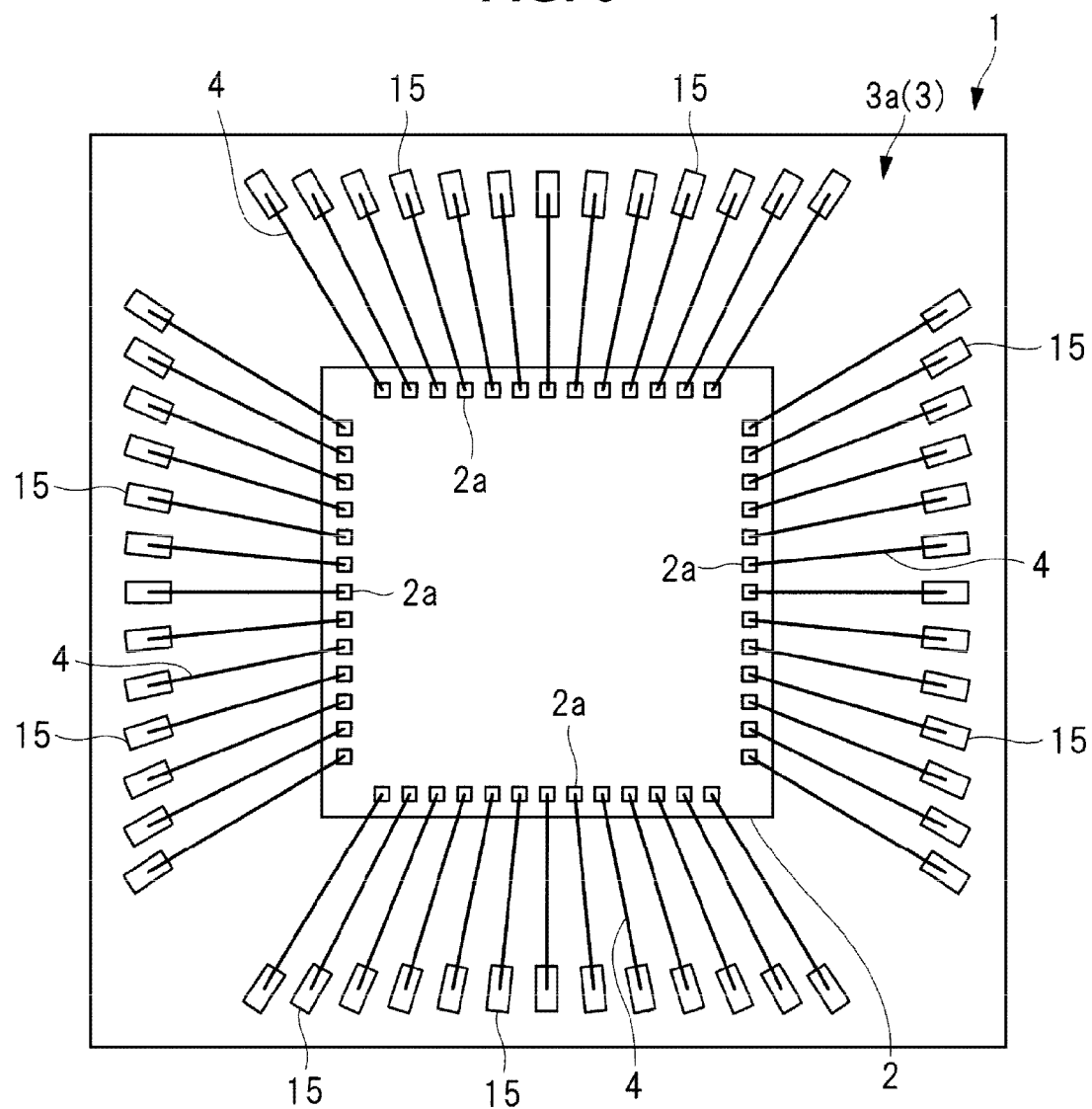
FIG. 5 is a plan view showing the structure of the semiconductor device in FIG. 1, through a sealing body.

FIG. 1 is a plan view showing an example of the structure of the semiconductor device of the embodiment, FIG. 2 is a rear view showing an example of the structure of the semiconductor device in FIG. 1, FIG. 3 is a cross-sectional view showing an example of the structure of the semiconductor device in FIG. 1, FIG. 4 is a side view showing an example of the structure of the semiconductor device in FIG. 1, and FIG. 5 is a plan view showing the structure of the semiconductor device in FIG. 1, through a sealing body.

The semiconductor device of the present embodiment shown in FIGS. 1 to 5 is a semiconductor device (semiconductor package) in which a semiconductor chip 2 is mounted (bonded, coupled, mounted) on a wiring substrate 3, and furthermore, is the semiconductor device in which the semiconductor chip 2 is sealed with a sealing resin.

Meanwhile, in the present embodiment, an explanation will be given while adopting the case where a plurality of external terminals provided on the lower surface side of the wiring substrate 3 is a solder ball 6 as an example of the semiconductor device. That is, in the present embodiment, an explanation will be given while adopting a BGA (Ball Grid Array) 1 as an example of the semiconductor device.

In addition, the BGA 1 of the present embodiment is one assembled by resin-molding multiple device areas at a time, subjecting the same to ball (external terminal) soldering, and then singulating the same by dicing, in the assembling thereof.

As to the configuration of the BGA 1, it includes the semiconductor chip 2, the wiring substrate 3 supporting or mounting the semiconductor chip 2, and a plurality of bonding wires (hereinafter, simply referred to as wire) 4 electrically coupling a plurality of electrodes 2a exposed to a surface (main surface) 2b of the semiconductor chip 2 to a plurality of coupling terminals (bonding lead) 15 of the wiring substrate 3 corresponding to these.

Furthermore, the BGA 1 has a sealing body 5 covering an upper surface 3a of the wiring substrate 3 including the semiconductor chip 2 and a wire 4, and a plurality of solder balls 6 provided on a lower surface 3b of the wiring substrate 3, in the area array arrangement as external terminals.

The semiconductor chip 2 is one obtained by forming various semiconductor elements or semiconductor integrated circuits on a main surface of a semiconductor substrate (semiconductor wafer) having a planar shape of a regular square (or may be rectangle) in the direction intersecting with the thickness thereof and being formed of, for example, single crystalline silicon or the like, and then by separating the semiconductor substrate into each semiconductor chip 2 through dicing or the like after performing backgrinding of the semiconductor substrate as necessary.

In addition, the semiconductor chip 2 also has the front surface (surface on semiconductor element-forming side, main surface, upper surface) 2b and the rear surface (surface on side opposite to semiconductor element-forming side, mounting surface, lower surface) 2c facing each other, the semiconductor chip 2 is mounted (disposed) over the upper surface (chip-supporting surface) 3a of the wiring substrate 3 so that the surface 2b thereof faces upward, and the rear surface 2c of the semiconductor chip 2 is caused to adhere and is fixed to the upper surface 3a of the wiring substrate 3, via an adhesive material (die bonding material, joining material) 8.

For example, an insulating or electroconductive paste material or an adhesive material in a film shape (die bonding film, die attaching film) or the like can be used as the adhesive material 8. The thickness of the adhesive material 8 can be set to be, for example, about 20 to 30 µm. The semiconductor chip 2 has a plurality of electrodes (bonding pad, pad electrode) 2a exposed to the front surface 2b side thereof, and these electrodes 2a are electrically coupled to the semiconductor element or semiconductor integrated circuit formed inside or in the surface layer part of the semiconductor chip 2.

Furthermore, the wiring substrate 3 has the upper surface 3a being one main surface, the lower surface 3b being the surface opposite to the upper surface 3a, the coupling terminals 15 formed so as to be exposed to the upper surface 3a, and a plurality of lands (bump land, land part) 16 formed so as to be exposed to the lower surface 3b.

The wiring substrate 3 has an insulating base material layer (insulating substrate, core material) 11, conductor layers (conductor pattern, conductor film pattern, wiring layer) 12 formed on the upper surface side and lower surface side of the base material layer 11, and a solder resist layer (insulating film, solder resist layer) 14 as an insulating layer (insulator layer, insulating film) formed so as to cover the conductor layer 12. As another form, the wiring substrate 3 can also be formed by a multilayer wiring substrate formed by stacking a plurality of insulating layers and a plurality of wiring layers.

The conductor layer 12 is patterned and forms a conductor pattern serving as a terminal, wiring or wiring layer of the wiring substrate 3. In addition, the conductor layer 12 is formed of an electroconductive material, and can be formed by, for example, a copper thin film or the like formed through a plating method.

Moreover, on the upper surface side of the wiring substrate 3, there are formed, in a plural number, the coupling terminals (electrode, bonding lead, pad electrode) 15 for electrically coupling the wire 4. On the other hand, on the lower surface side of the wiring substrate 3, there are formed, in a plural number, the electroconductive lands (electrode, pad, terminal) 16 for connecting a solder ball 6. In addition, the coupling terminals 15 on the upper surface side of the base material layer 11 and the lands 16 on the lower surface side of the base material layer 11 are electrically coupled.

Accordingly, the electrodes 2a of the semiconductor chip 2 are electrically coupled to the coupling terminals 15 of the wiring substrate 3 via a plurality of wires 4, and, furthermore, are electrically coupled to the lands 16 of the wiring substrate 3 via the conductor layer 12 of the wiring substrate 3.

Meanwhile, the wire 4 is formed of a metal thin wire such as a gold wire.

Furthermore, the solder resist layer 14 has such a function as an insulating layer (insulating film) protecting the conductor layer 12, is formed of an insulator material such as, for example, an organic resin material, and is formed on the upper surface side and lower surface side of the base material layer 11 so as to cover the conductor layer 12. Meanwhile, the thickness of the solder resist layer 14 can be set to be, for example, about 20 to 30 µm. In addition, the semiconductor chip 2 is mounted over the solder resist layer 14 on the upper surface 3a side of the wiring substrate 3, via the adhesive material 8.

Moreover, the lands 16 are formed so as to be exposed to the lower surface 3b of the wiring substrate 3 and are disposed in an array shape, and to each of the lands 16, the solder ball (ball electrode, protruding electrode, electrode, external terminal, terminal for external coupling) 6 is coupled (formed). Therefore, a plurality of solder balls 6 is disposed in an array shape on the lower surface 3b of the wiring substrate 3.

In addition, the solder ball 6 can function as an external terminal (terminal for external coupling) of the BGA 1. Therefore, the BGA 1 of the present embodiment has plural terminals for external coupling (here, solder ball 6) formed over the lands 16, respectively, of the lower surface 3b of the wiring substrate 3. Accordingly, the electrodes 2a of the semiconductor chip 2 are electrically coupled to the coupling terminals 15 of the wiring substrate 3 via the wires 4, and are furthermore electrically coupled to the lands 16 of the wiring substrate 3 and the solder balls 6 connected to the lands 16, via the conductor layer 12 of the wiring substrate 3.

Meanwhile, the same also applies to the case of a semiconductor device of an LGA (Land Grid Array) structure having a conductor land, which is not connected to a solder ball as a terminal for external coupling, as an external coupling terminal.

Furthermore, the wire 4 is coupled to the coupling terminal 15 exposed to the opening of the solder resist layer 14 formed on the upper surface side of the wiring substrate 3, and in order to make the coupling of the wire 4 to the coupling terminal 15 easy or reliable, on the upper surface of the coupling terminal 15 (coupling surface of wire 4), a gold plating layer (or a stacked film of a nickel plating layer (lower layer side) and a gold plating layer (upper layer side)) or the like is formed.

Moreover, the sealing body (sealing resin, sealing resin part, sealing part) 5 is formed of a resin material such as, for example, a heat-curable resin material, and can also contain a filler or the like. For example, the sealing body 5 can also be formed using an epoxy resin containing a filler, or the like. The sealing body 5 is formed over the upper surface 3a of the wiring substrate 3 so as to cover the semiconductor chip 2 and the wires 4. That is, the sealing body 5 is formed over the upper surface 3a of the wiring substrate 3, and seals and protects the semiconductor chip 2 and the wire 4.

<Method of Manufacturing Semiconductor Device>

Figure 6:
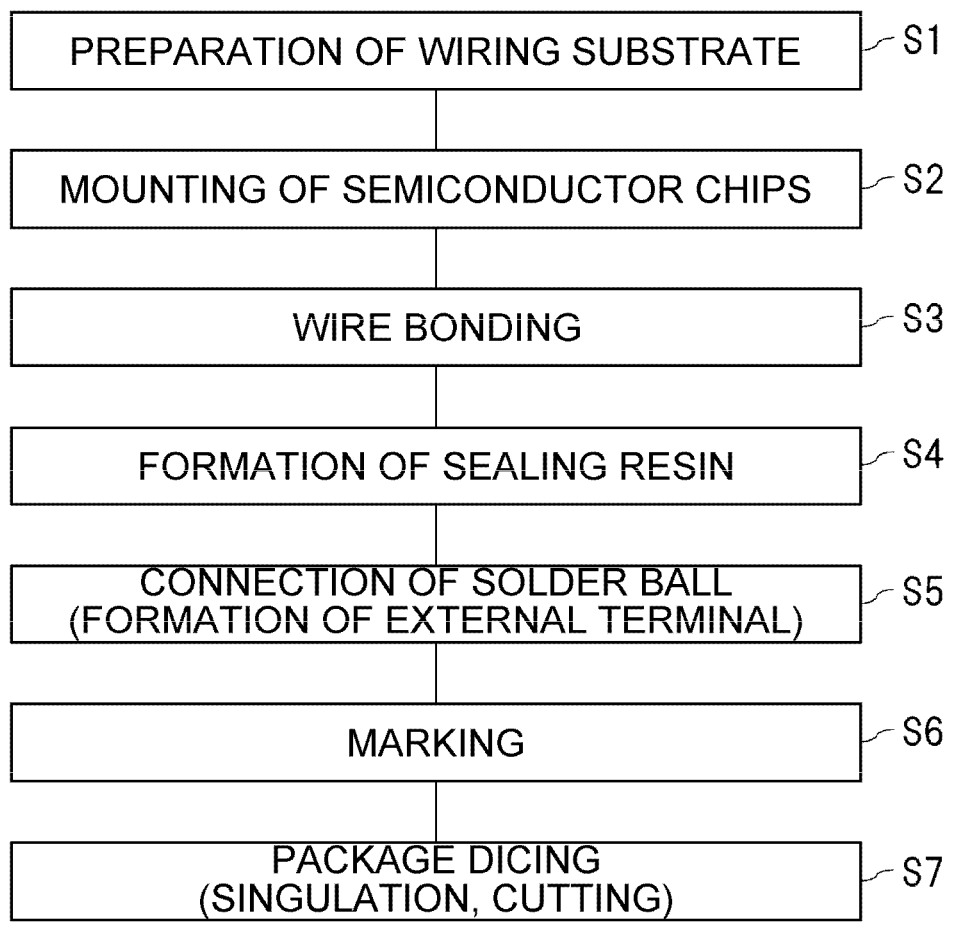
FIG. 6 is a flow diagram showing an example of an assembling procedure of the semiconductor device in FIG. 1.

FIG. 6 is a flow diagram showing an example of an assembling procedure of the semiconductor device in FIG. 1.

The method of manufacturing the semiconductor device of the present embodiment will be explained along the flow diagram in FIG. 6.

1. Process of Providing Substrate

Figure 7:
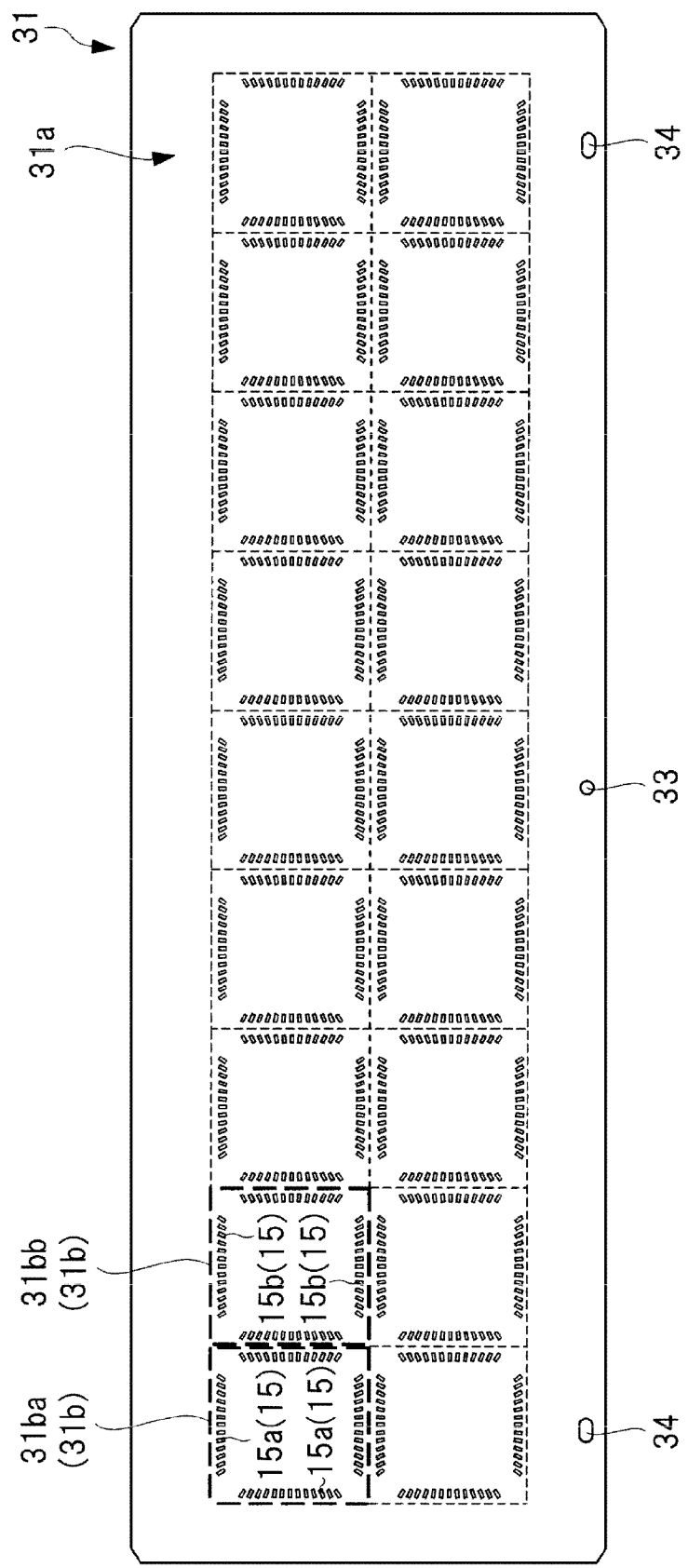
FIG. 7 is a plan view showing an example of the structure of a chip mounting surface side of a wiring substrate for use in assembling the semiconductor device in FIG. 1.
Figure 8:
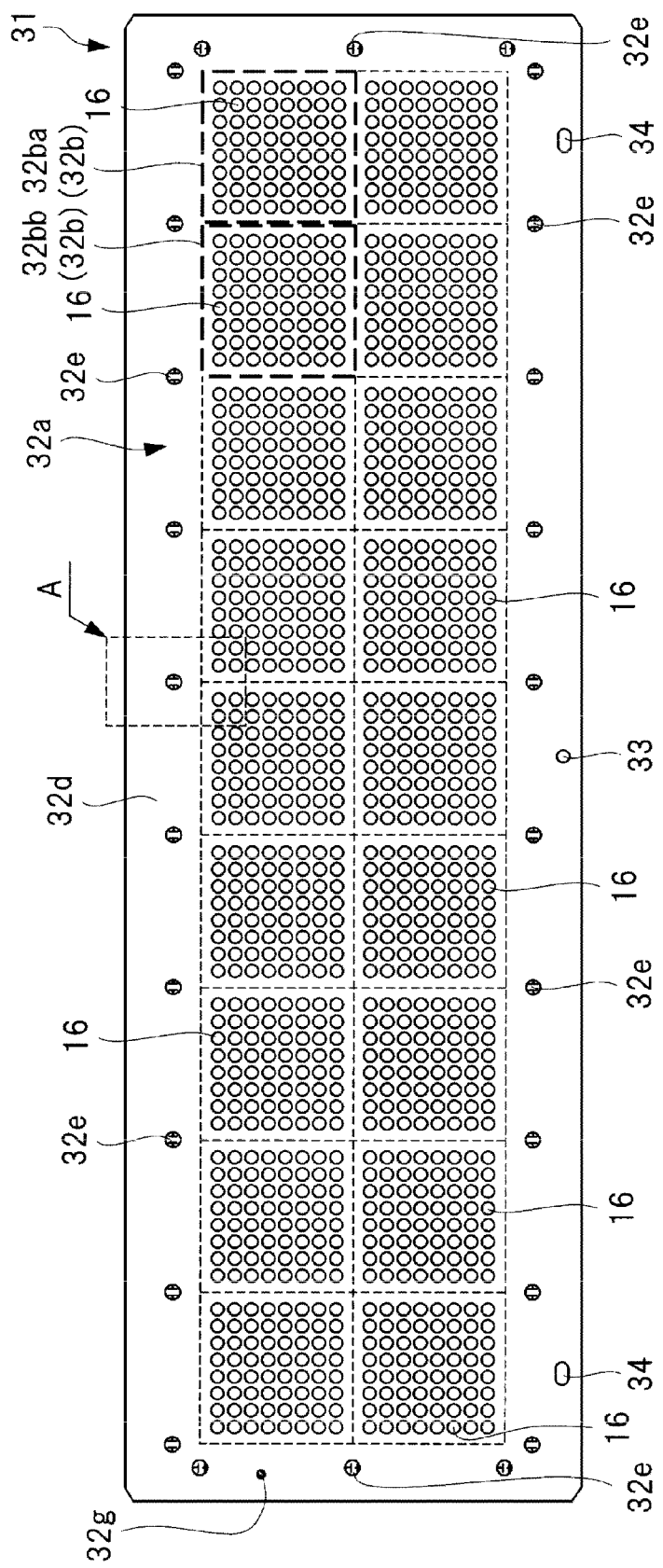
FIG. 8 is a rearview showing an example of the structure of a mounting surface side of the wiring substrate for use in assembling the semiconductor device in FIG. 1.
Figure 9:
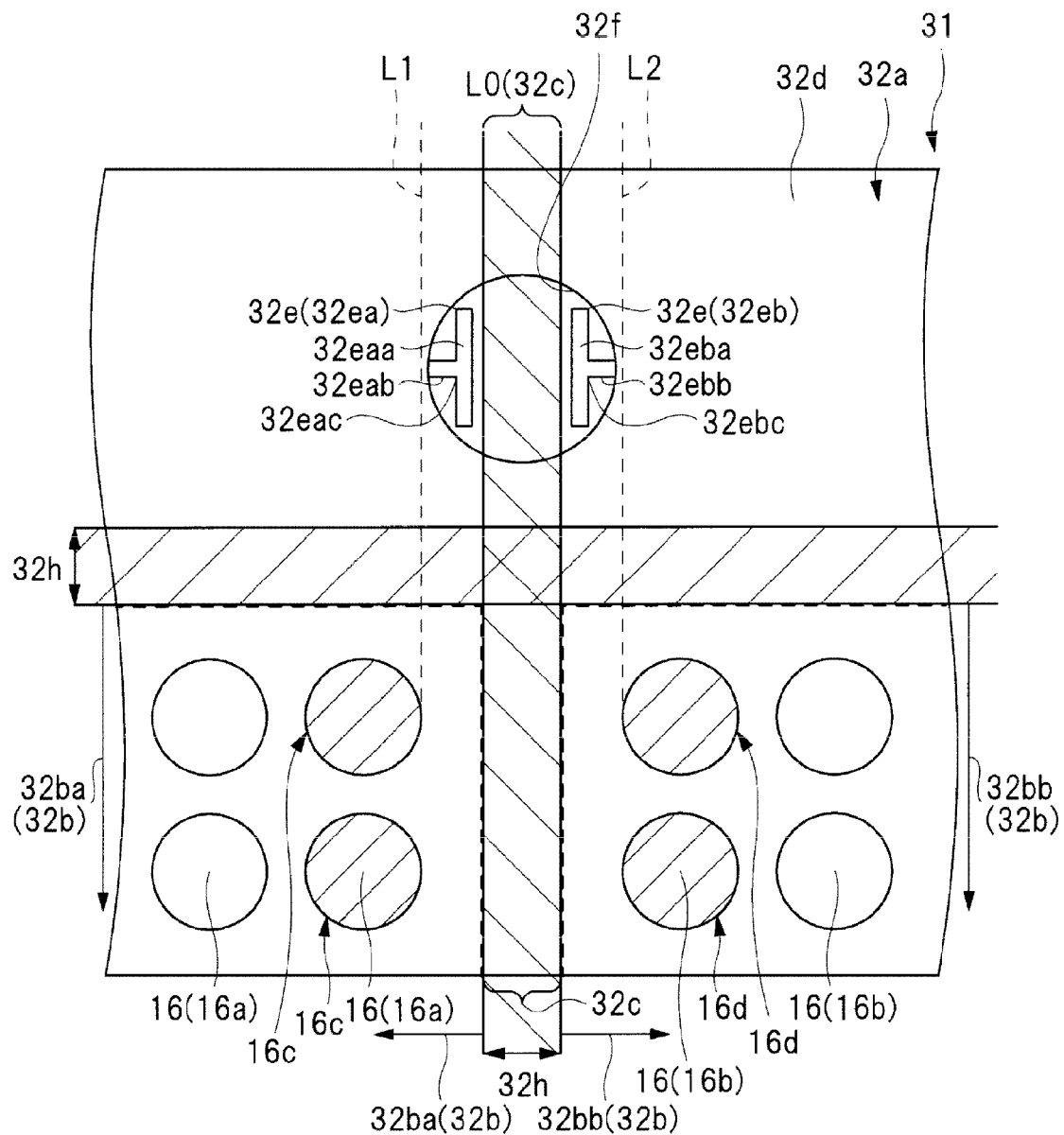
FIG. 9 is a partially enlarged plan view showing an A part in an enlarged manner, in FIG. 8.
Figure 10:
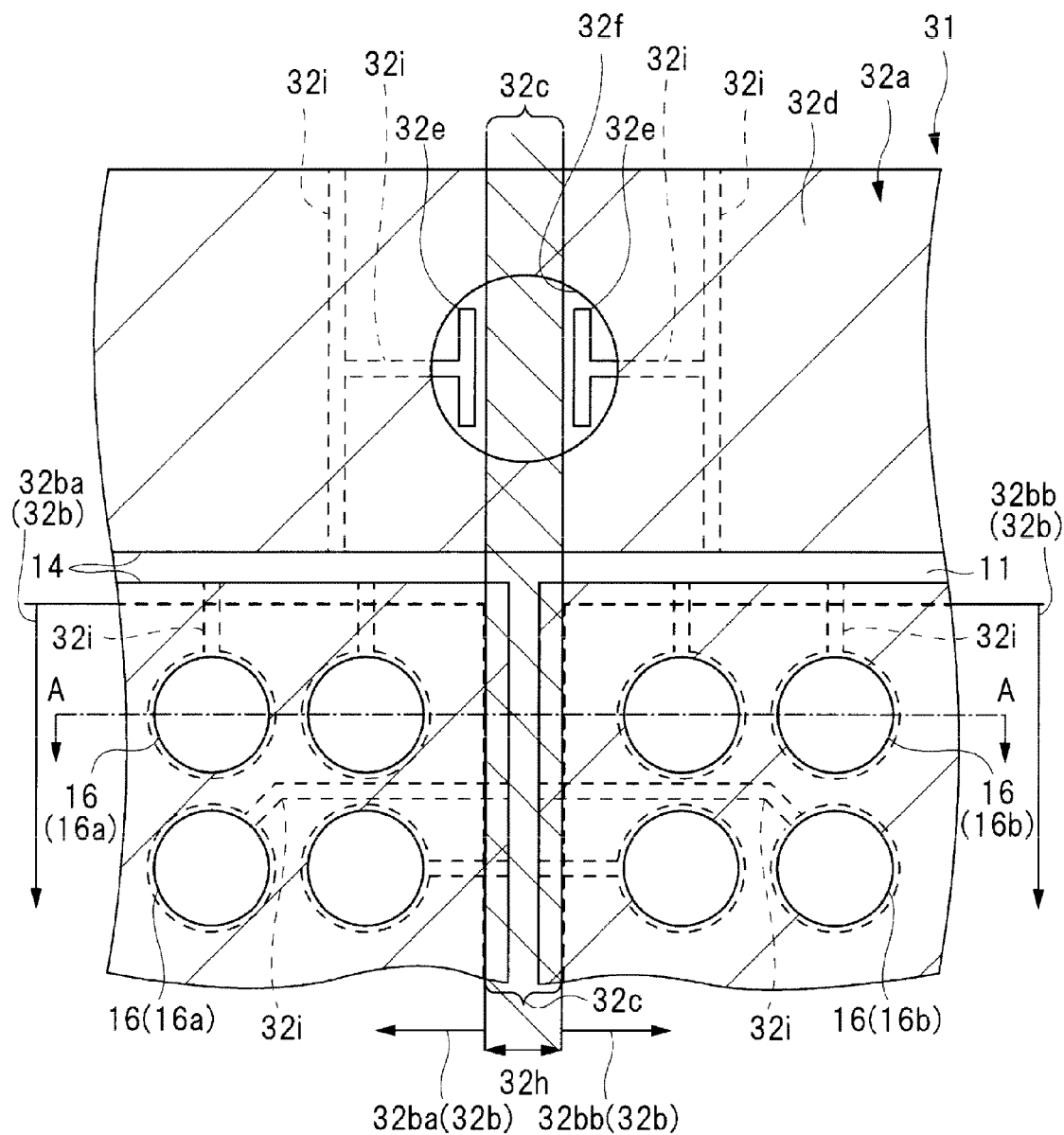
FIG. 10 is a partially enlarged plan view showing an example of a wiring pattern after etching-back in a substrate region in FIG. 9.
Figure 11:
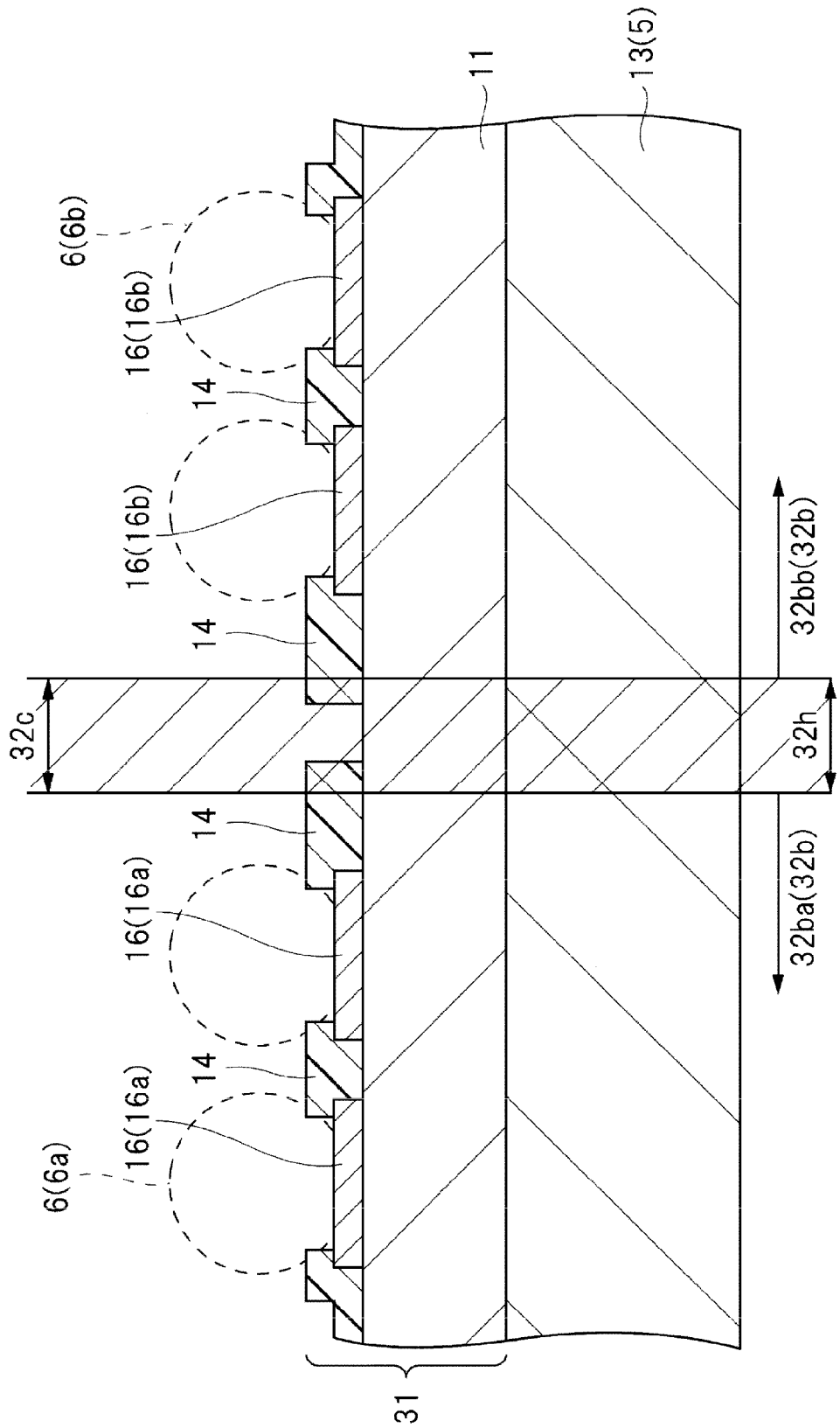
FIG. 11 is a partial cross-sectional view showing an example of a structure cut along an A-A line in FIG. 10.

FIG. 7 is a plan view showing an example of the structure of a chip mounting surface side of a wiring substrate for use in assembling the semiconductor device in FIG. 1, FIG. 8 is a rear view showing an example of the structure of a mounting surface side of a wiring substrate for use in assembling the semiconductor device in FIG. 1, FIG. 9 is a partially enlarged plan view showing the A part in an enlarged manner, in FIG. 8, FIG. 10 is a partially enlarged plan view showing an example of a wiring pattern after etching-back in a substrate region in FIG. 9, and FIG. 11 is a partial cross-sectional view showing an example of a structure cut along the A-A line in FIG. 10.

First, a wiring substrate (wiring substrate mother body) 31 shown in FIGS. 7 and 8 is provided (Step S1 in FIG. 6). An explanation will be given of the embodiment by using the wiring substrate (wiring substrate mother body) 31, in which a plurality of semiconductor device regions (device area, substrate region, unit substrate region) 31$b$ and 32$b$ and a dicing region (scribing region, cutting region) provided between adjacent semiconductor device regions among the semiconductor device regions 31$b$ and 32$b$ are provided as shown in FIGS. 7 and 8.

Here, the wiring substrate 31 of the present embodiment is a mother body of the wiring substrate 3 shown in each of FIGS. 3 to 5. In other words, the wiring substrate 3 included in the semiconductor device is a part of the wiring substrate (wiring substrate mother body) 31. Consequently, the wiring substrate 3 included in the semiconductor device corresponds to the semiconductor device region 31$b$ that is separated by cutting the wiring substrate 31 in a cutting process (singulation process) to be mentioned later.

Meanwhile, in the present embodiment, an explanation will be given of one in which the semiconductor device regions 31$b$ to be provided on the wiring substrate (wiring substrate mother body) 31 are provided in a matrix shape (a lattice shape) in a plan view, but the shape is not limited to this and the regions may be provided in a row.

Furthermore, in explaining the details of the assembling process, the explanation will be given of the embodiment by adoption of, among the semiconductor device regions 31$b$ disposed in a matrix shape, for example, a semiconductor device region 31$ba$ (see FIGS. 7 and 8) and a semiconductor device region 31$bb$ (see FIGS. 7 and 8) positioned next to the semiconductor device region 31$ba$, as representatives.

The wiring substrate 31 includes an upper surface (chip mounting surface) 31$a$, and a lower surface (mounting surface) 32$a$ on the side opposite to the upper surface 31$a$. On the upper surface 31$a$, as shown in FIG. 7, there are provided a semiconductor device region (upper surface side device area) 31$ba$ and a semiconductor device region (upper surface side device area) 31$bb$ provided next to the semiconductor device region 31$ba$.

Figure 12:
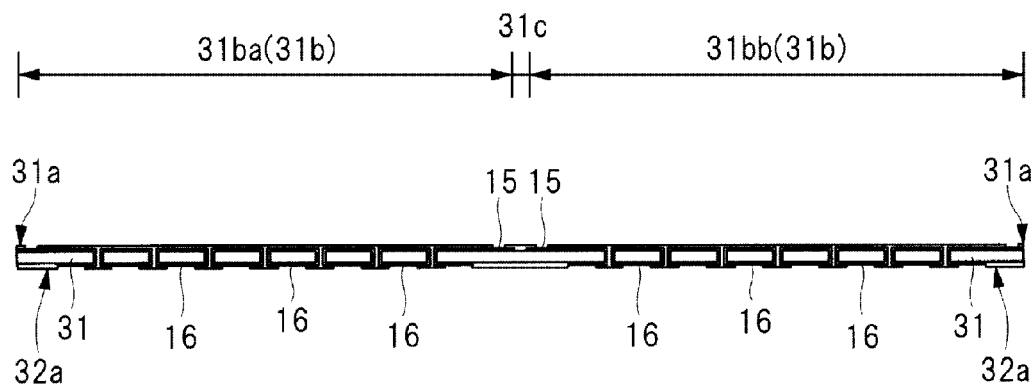
FIG. 12 is a partially enlarged cross-sectional view showing an example of the structure of a wiring substrate that is prepared in a substrate preparation process of assembling the semiconductor device in FIG. 1.

In addition, as shown in FIGS. 9 and 12 to be mentioned later, a dicing region (upper surface side dicing region) 31$c$ is provided between the semiconductor device region 31$ba$ and the semiconductor device region 31$bb$.

Furthermore, in the semiconductor device region 31$ba$, as shown in FIG. 7, a plurality of coupling terminals (bonding lead, electrode) 15$a$ is provided. Moreover, in the semiconductor device region 31$bb$, a plurality of coupling terminals (bonding lead, electrode) 15$b$ is provided. In addition, on the upper surface 31$a$ side, the solder resist layer (insulating film) 14 (see FIG. 3) is formed so that coupling terminals 15 (15$a$ and 15$b$) are exposed.

On the other hand, as shown in FIG. 8, the lower surface 32$a$ has a semiconductor device region (device area) 32$ba$ provided in a position overlapping the semiconductor device region 31$ba$ in FIG. 7, and a semiconductor device region (device area) 32$bb$ provided in a position overlapping the semiconductor device region 31$bb$ in FIG. 7. Meanwhile, the semiconductor device region (device area) 32$bb$ is provided next to the semiconductor device region (device area) 32$ba$ in a plan view.

Furthermore, on the lower surface 32$a$, as shown in FIG. 9, a dicing region (scribing region, cutting region) 32$c$ is provided between the semiconductor device region 32$ba$ and the semiconductor device region 32$bb$.

The dicing region 32$c$ of the present embodiment is a region designed to be cut (removed) with a dicing blade 9 used (see FIG. 23 mentioned later) in a cutting process to be mentioned later. Therefore, in the present embodiment, the width of the dicing region 32$c$ corresponds to the width of the dicing blade 9, that is, a blade width (cutting width) 32$h$ shown in FIG. 9.

However, in some cases, due to a positional displacement of an insulating film (solder resist layer 14 shown in FIG. 11) generated in the manufacturing process of the wiring substrate 31, looseness of the dicing blade 9 to be used, or the like, the cutting may be performed in a position somewhat shifted from the designed dicing region 32$c$.

In addition, on the lower surface 32$a$ of the wiring substrate 31 of the present embodiment, as shown in FIGS. 8 and 9, a peripheral part (frame part) 32$d$ is provided around the semiconductor device regions 32$ba$ and 32$bb$ and the dicing region 32$c$. Furthermore, in the peripheral part (frame part) 32$d$, a target mark (target pattern) 32$e$, which is not provided on an extension line L0 of the dicing region 32$c$, is provided.

Meanwhile, in another expression, the peripheral part (frame part) 32$d$ is a frame part provided around the semiconductor device region (device area) 32$ba$, the semiconductor device region (device area) 32$bb$ and the dicing region (scribing region, cutting region) 32$c$ in a plan view. In other words, the peripheral part (frame part) 32$d$ is a part that surrounds the semiconductor device region (device area) 32$ba$, the semiconductor device region (device area) 32$bb$ and the dicing region 32$c$ in a plan view.

Here, the target mark 32$e$ is an indicator (mark) for deriving a dicing line (cutting portion) along which the above-mentioned dicing blade 9 runs in the above-mentioned cutting process, and accordingly, a pair of target marks 32$e$ are provided at both ends of the dicing line in response to each dicing line to be derived and in portions facing each other.

Consequently, in the cutting process, the dicing line is derived through recognition of the target mark 32$e$ by an image recognition method or the like, and on the basis of the recognition result, cutting is carried out by rotation and running of the dicing blade 9 along the dicing line.

In addition, as shown in FIG. 8, in each of the semiconductor device regions 32$ba$ and 32$bb$ on the lower surface 32$a$, the lands (bump land, electrode) 16 are formed. In detail, as shown in FIG. 9, on the lower surface 32$a$, there are formed a plurality of lands (bump land, electrode) 16$a$ provided in a matrix shape in the semiconductor device region 32$ba$, a plurality of lands (bump land, electrode) 16$b$ provided in a matrix shape in the semiconductor device region 32$bb$, and the solder resist layer (insulating film) 14 shown in FIG. 11 formed on the lower surface 32a side so that the lands 16a and 16b are exposed.

That is, as shown in FIG. 8, on the lower surface 32a of the wiring substrate 31, each of the semiconductor device regions 32ba and 32bb is quadrilateral in a plan view, and in each of the semiconductor device regions 32ba and 32bb, the lands 16 for external terminals are disposed in a matrix shape (lattice shape).

In the peripheral part 32d on the lower surface 32a of the wiring substrate 31, there are provided an alignment pattern 32g used in manufacturing a substrate, a positioning hole 33 and a guide hole 34 used during conveyance or the like in an assembling process of the semiconductor device. However, the alignment pattern 32g may not be provided.

On the other hand, as shown in FIG. 7, in each of the semiconductor device regions 31ba and 31bb on the upper surface 31a of the wiring substrate 31, a plurality of coupling terminals 15 is formed. In detail, on the upper surface 31a of the wiring substrate 31, each of the semiconductor device regions 31ba and 31bb is rectangular in a plan view, and the coupling terminals 15 are provided along the peripheral part (along four sides) of each of the semiconductor device regions 31ba and 31bb.

Next, the target mark 32e formed on the lower surface 32a of the wiring substrate 31 will be explained in detail.

As shown in FIG. 9, the target mark 32e is formed of an electroconductive member (metal), and is exposed from an opening 32f of the solder resist layer 14 (see FIG. 11) of the wiring substrate 31 so that the image can be recognized. That is, the target mark 32e is a part exposed from the opening 32f of the solder resist layer 14, and the target mark 32e of the present embodiment is formed of a material containing, for example, copper (Cu) as a main component.

In addition, the lands 16a of the wiring substrate 31 have an outermost peripheral land row (outermost peripheral bump land row) 16c disposed in the outermost peripheral row among the lands 16a. Meanwhile, in FIG. 9, hatching is attached to the land 16a in the outermost peripheral land row 16c, and the outermost peripheral land row 16c is a land row positioned nearest to the dicing region 32c. Similarly, the lands 16b have an outermost peripheral land row (outermost peripheral bump land row) 16d disposed in the outermost peripheral row among the lands 16b. Meanwhile, hatching is also attached to the land 16b in the outermost peripheral land row 16d, and also the outermost peripheral land row 16d is a land row positioned nearest to the dicing region 32c.

In addition, the target mark 32e of the present embodiment is provided, in a plan view, between the extension line L0 of the dicing region 32c and an imaginary extension line L1 of the outermost peripheral land row 16c, and between the extension line L0 of the dicing region 32c and an imaginary extension line L2 of the outermost peripheral land row 16d.

That is, the target mark 32e is not provided on the extension line L0 of the dicing region 32c, but is positioned outside the extension line L0 of the dicing region 32c and inside the imaginary extension lines L1 and L2 of outermost peripheral land rows 16c and 16d.

Here, the imaginary extension line L1 in the present embodiment means an imaginary line on the extension of a tangent line contacting a part nearest to the dicing region 32c of the land 16a in the outermost peripheral land row 16c among the lands 16a in the semiconductor device region 32ba. Similarly, the imaginary extension line L2 in the present embodiment means an imaginary line on the extension of a tangent line contacting a part nearest to the dicing region 32c of the land 16b in the outermost peripheral land row 16d among the lands 16b in the semiconductor device region 32bb.

The target mark 32e of the present embodiment includes a first pattern 32ea and a second pattern 32eb provided next to the first pattern 32ea and spaced (separated) from the first pattern 32ea.

That is, the first pattern 32ea and the second pattern 32eb are provided separated from each other so that the dicing blade 9 runs through the region between the first pattern 32ea and the second pattern 32eb during cutting. Accordingly, the space (separation distance) between the first pattern 32ea and the second pattern 32eb is larger than the width of the dicing region 32c (the length in the direction intersecting with the extension direction of the pattern, or the space between semiconductor device regions adjacent to each other).

Figure 36:
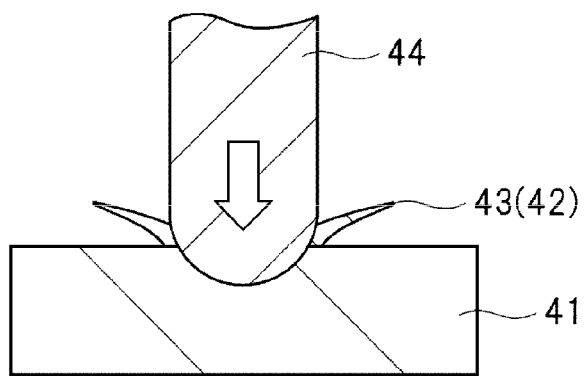
FIG. 36 is a partial cross-sectional view showing a structure in cutting the substrate according to a Comparative Example.

Consequently, since the dicing blade 9 does not passes on the target mark 32e during cutting, the dicing blade 9 does never cut the electroconductive member (metal) in the dicing region 32c, and the generation of the foreign substance 43 as shown in FIG. 36 can be suppressed.

Furthermore, when another expression is used, the space between the first pattern 32ea and the second pattern 32eb constituting the target mark 32e is smaller than the space between the imaginary extension line L1 of the outermost peripheral land row 16c and the imaginary extension line L2 of the outermost peripheral land row 16d.

Accordingly, in the target mark 32e of the present embodiment, the main part thereof in the first pattern 32ea is provided between the extension line L0 of the dicing region 32c and the imaginary extension line L1 of the outermost peripheral land row 16c in a plan view. On the other hand, the main part of the target mark 32e in the second pattern 32eb is provided between the extension line L0 of the dicing region 32c and the imaginary extension line L2 of the outermost peripheral land row 16d in a plan view.

Meanwhile, when an electrolytic plating method is adopted for the target mark 32e, a feeder line 32i for plating shown in FIG. 10 is connected to the target mark 32e and drawn. In this case, when the dicing region 32c is to be specified, the recognition is performed by the main part. Here, the main part in the first pattern 32ea and the second pattern 32eb means a part that is necessary for at least the recognition of the pattern.

That is, the first pattern 32ea and the second pattern 32eb of the target mark 32e are portions exposed from the opening 32f of the solder resist layer 14 in FIG. 11 formed on the lower surface 32a side of the wiring substrate 31, but, when the feeder line 32i for plating shown in FIG. 10 is connected to the target mark 32e, not all the patterns exposed to the opening 32f need to be the target mark 32e. That is, in the pattern exposed to the opening 32f of the solder resist layer 14, the smallest pattern portion necessary for the recognition may be defined as the target mark 32e.

For example, the planer shape of the main part of each of the first pattern 32ea and the second pattern 32eb of the target mark 32e is preferably formed of a rectangle having a long side extending in the direction along the extension line L0 of the dicing region 32c.

However, in the present embodiment, for example, the target mark 32e is formed by etching, and thus the respective corners of the pattern of the target mark 32e are rounded, but an explanation will be given while considering also the shape as a rectangle.

Here, in the example shown in FIG. 9, the first pattern 32ea is provided between the extension line L0 of the dicing region 32c and the imaginary extension line L1 of the outermost peripheral land row 16c in a plan view, whereas the second pattern 32eb is provided between the extension line L0 of the dicing region 32c and the imaginary extension line L2 of the outermost peripheral land row 16d in a plan view.

Furthermore, the first pattern 32ea of the target mark 32e of the present embodiment is constituted of a first extension part 32eaa extending along the extension direction of the dicing region 32c and a second extension part 32eab that intersects with the first extension part 32eaa. That is, the first pattern 32ea has an intersecting part 32eac obtained by the intersection of patterns each other.

On the other hand, the second pattern 32eb of the target mark 32e is also constituted of a first extension part 32eba extending along the extension direction of the dicing region 32c and a second extension part 32ebb that intersects with the first extension part 32eba, and an intersecting part 32ebc obtained by the intersection of the first extension part 32eba and the second extension part 32ebb. That is, the second pattern 32eb also has an intersecting part 32ebc obtained by the intersection of patterns each other.

As described above, in the target mark 32e of the present embodiment, both the first pattern 32ea and the second pattern 32eb thereof have intersecting parts 32eac and 32ebc, respectively. That is, the target mark 32e of the present embodiment has a planar shape that includes intersecting parts 32eac and 32ebc. For example, the target mark has a cross shape, an H letter shape, a T letter shape, or the like.

The target mark 32e has the shape including intersecting parts 32eac and 32ebc as described above, and in cutting process, intersecting parts 32eac and 32ebc are recognized when the target mark 32e is to be recognized, and thus the determination of θ displacement of the wiring substrate 31 can be performed with high accuracy. Furthermore, the identification of a position (line) to be cut with the dicing blade 9 can be performed with higher accuracy.

Meanwhile, the intersecting part in the target mark 32e is not necessarily be provided in both of the first pattern 32ea and second pattern 32eb, but may be provided in at least one of patterns, or both of the first pattern 32ea and the second pattern 32eb may not have the intersecting part.

Furthermore, as shown in FIGS. 10 and 11, as to the wiring substrate 31 for use in the present embodiment, in the dicing region 32c thereof, the feeder line 32i for plating is removed by etching or the like. In detail, on each surface of the lands 16, a plating film is formed, and, in the process of forming the plating film, the plating film is formed using the feeder line 32i formed in the dicing region 32c. Meanwhile, in the process of forming the above-mentioned plating film, over the upper surface of the wiring substrate 31, the solder resist layer 14 is formed. In addition, after forming the above-mentioned plating film, the feeder line 32i and the solder resist layer 14 covering the feeder line 32i are removed by etching or the like. That is, in the wiring substrate 31 for use in assembling the semiconductor device, the feeder line 32i for plating provided in the dicing region 32c thereof has previously been removed. Accordingly, as shown in FIG. 11, the dicing region 32c is in a state where the surface of the base material layer (insulating layer) 11, which is positioned in the lower layer (internal layer) of the solder resist layer (insulating film, protective film) 14 formed on the upper surface side of the wiring substrate 31, is exposed.

<From Die Bonding Process to Cutting Process>

Figure 13:
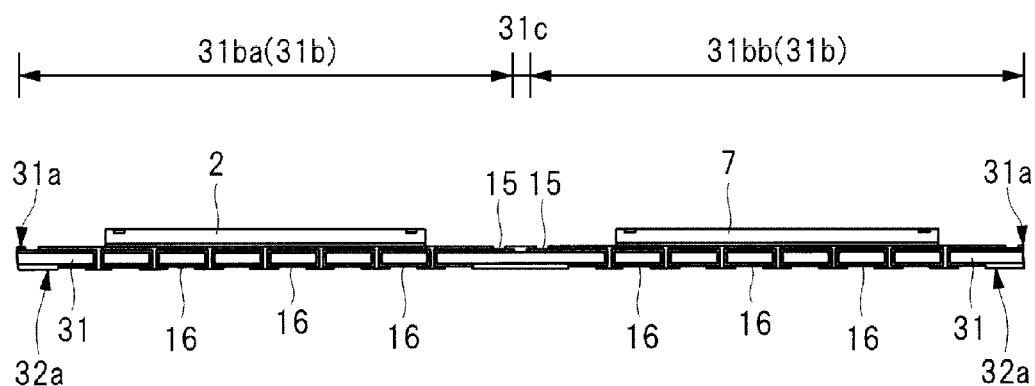
FIG. 13 is a partially enlarged cross-sectional view showing an example of the structure after die bonding in assembling the semiconductor device in FIG. 1.
Figure 14:
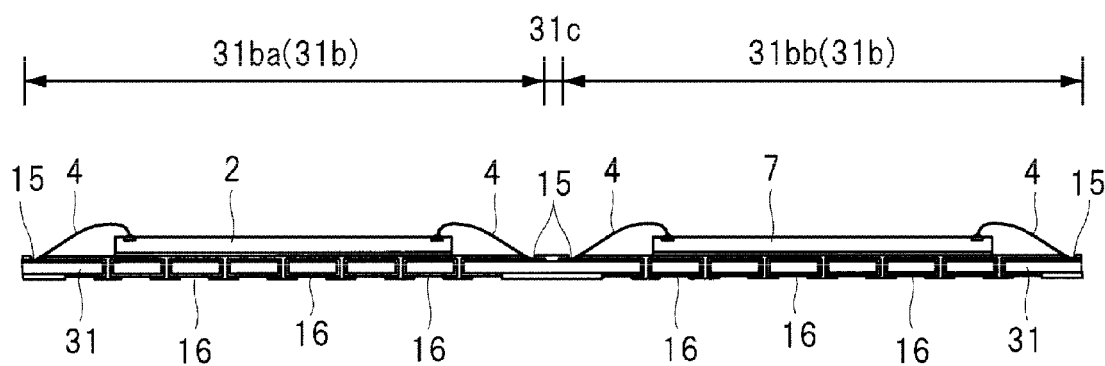
FIG. 14 is a partially enlarged cross-sectional view showing an example of the structure after wire bonding in assembling the semiconductor device in FIG. 1.
Figure 15:
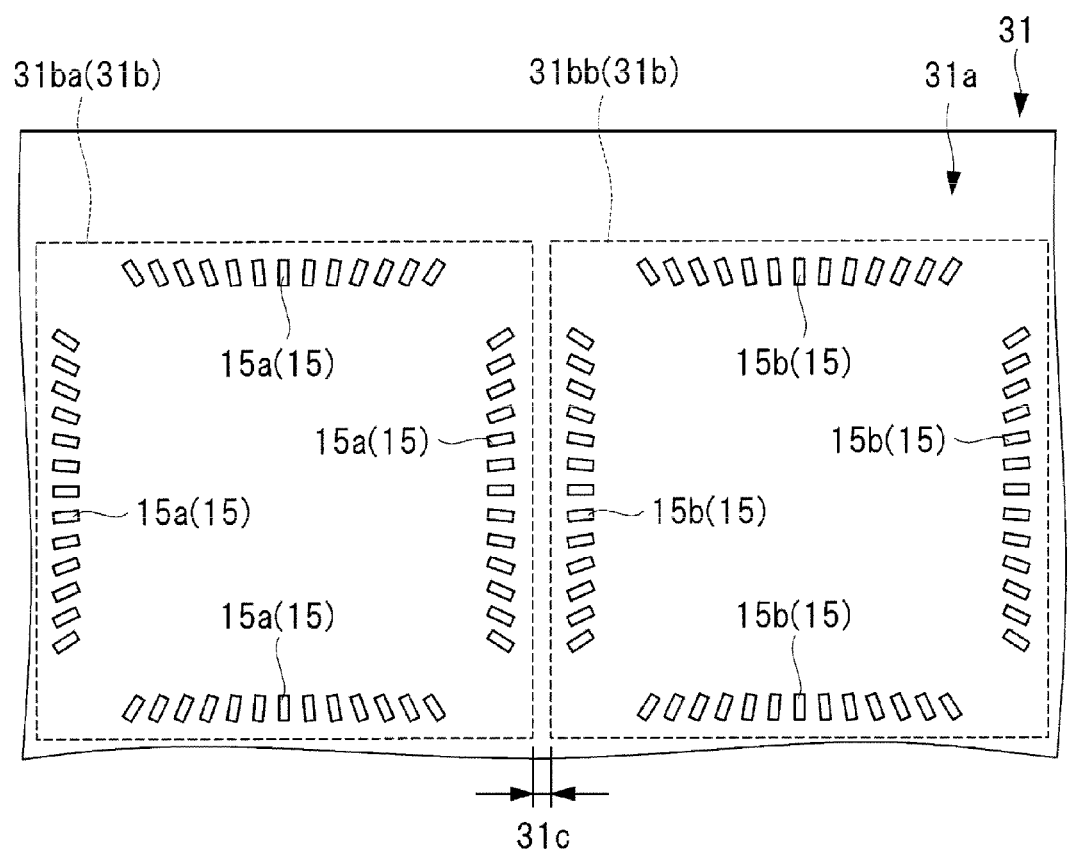
FIG. 15 is a partially enlarged plan view showing an example of the structure of the wiring substrate shown in FIG. 12.
Figure 16:
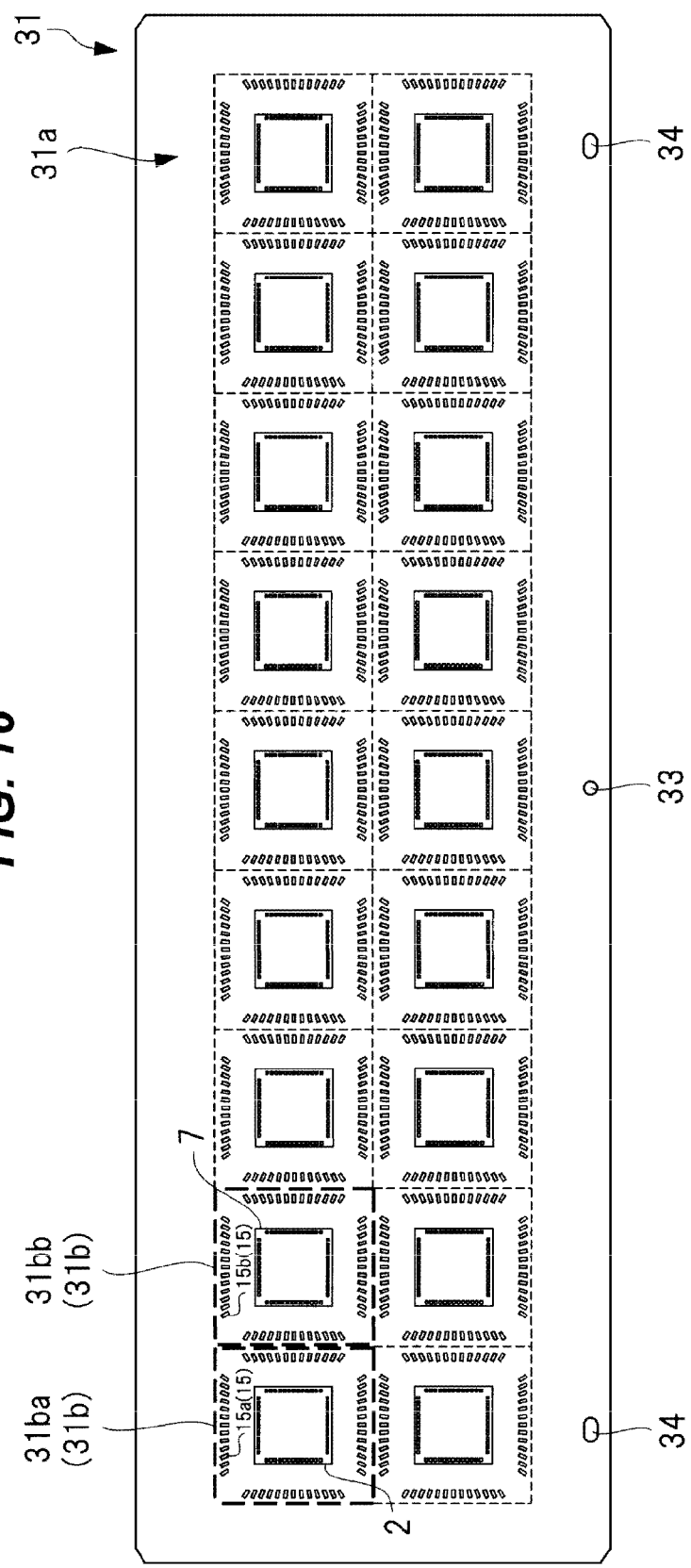
FIG. 16 is a plan view showing an example of the entire structure of the substrate after the die bonding shown in FIG. 13.
Figure 17:
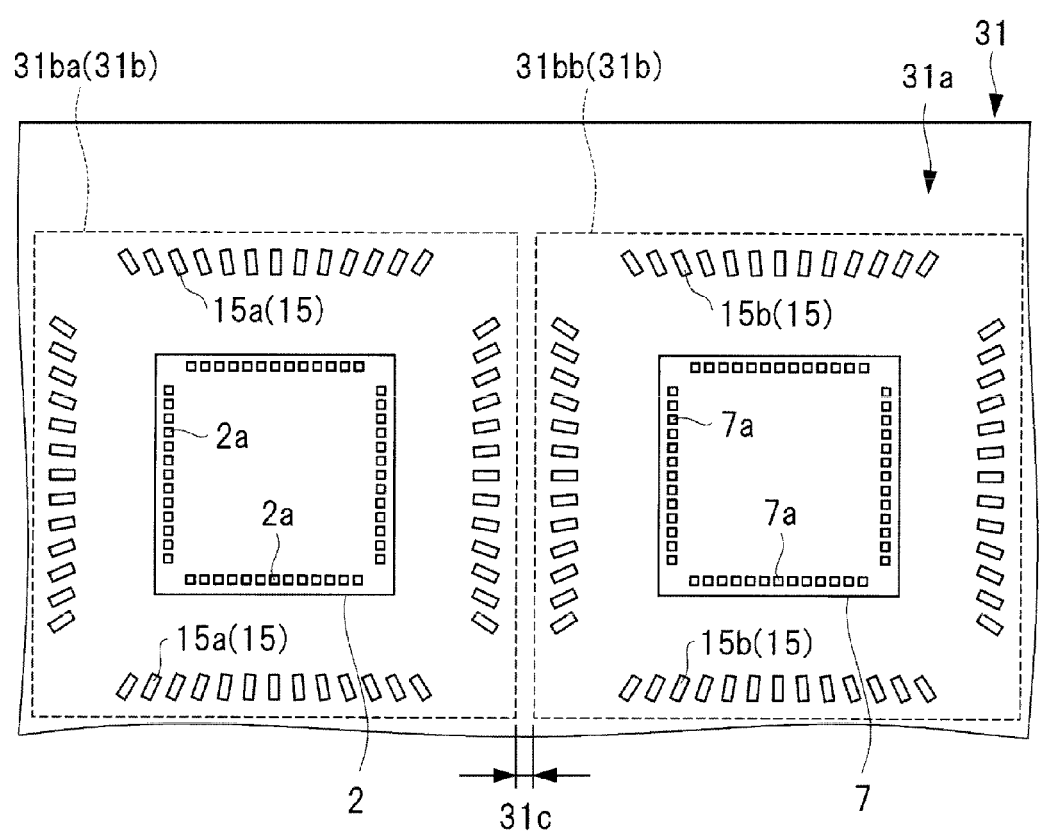
FIG. 17 is a partially enlarged plan view showing an example of the structure after the die bonding shown in FIG. 13.
Figure 18:
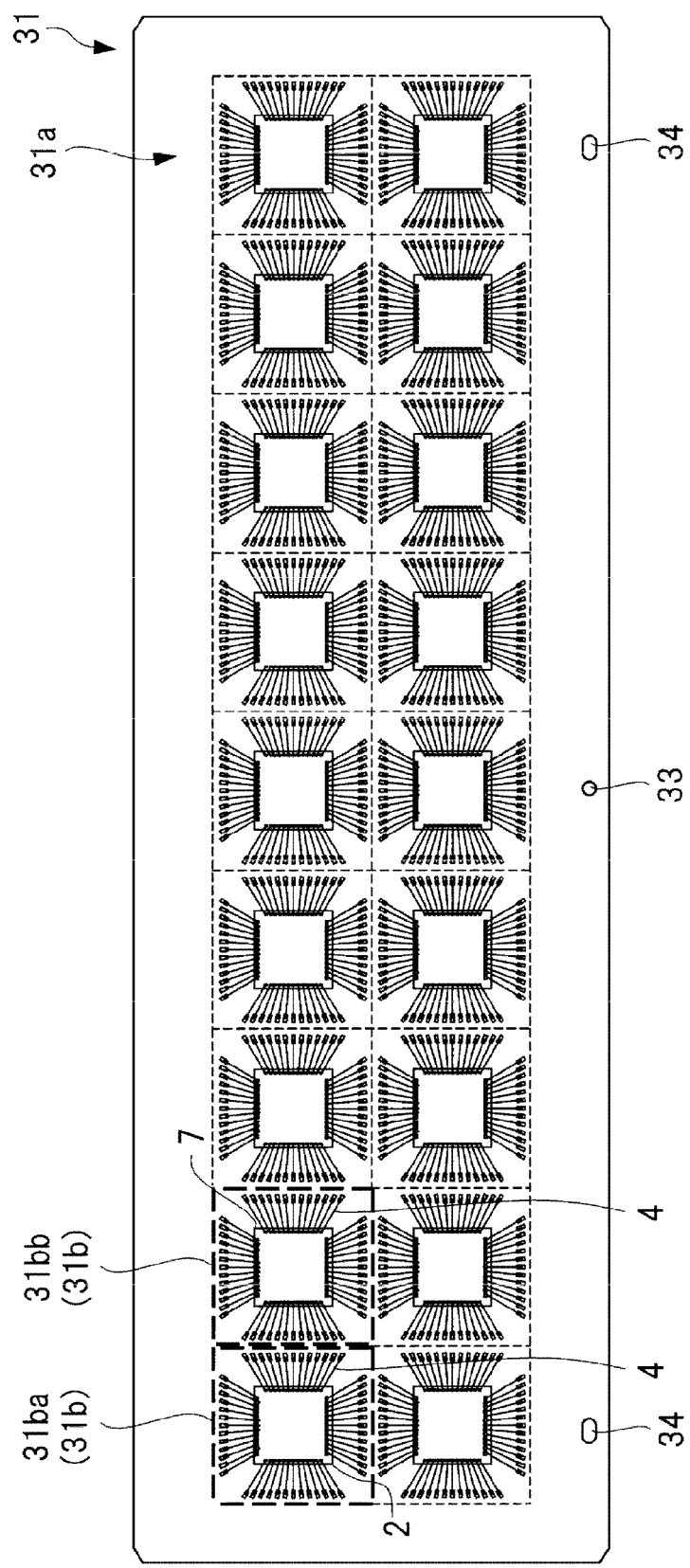
FIG. 18 is a plan view showing an example of the entire structure of the substrate after the wire bonding shown in FIG. 14.
Figure 19:
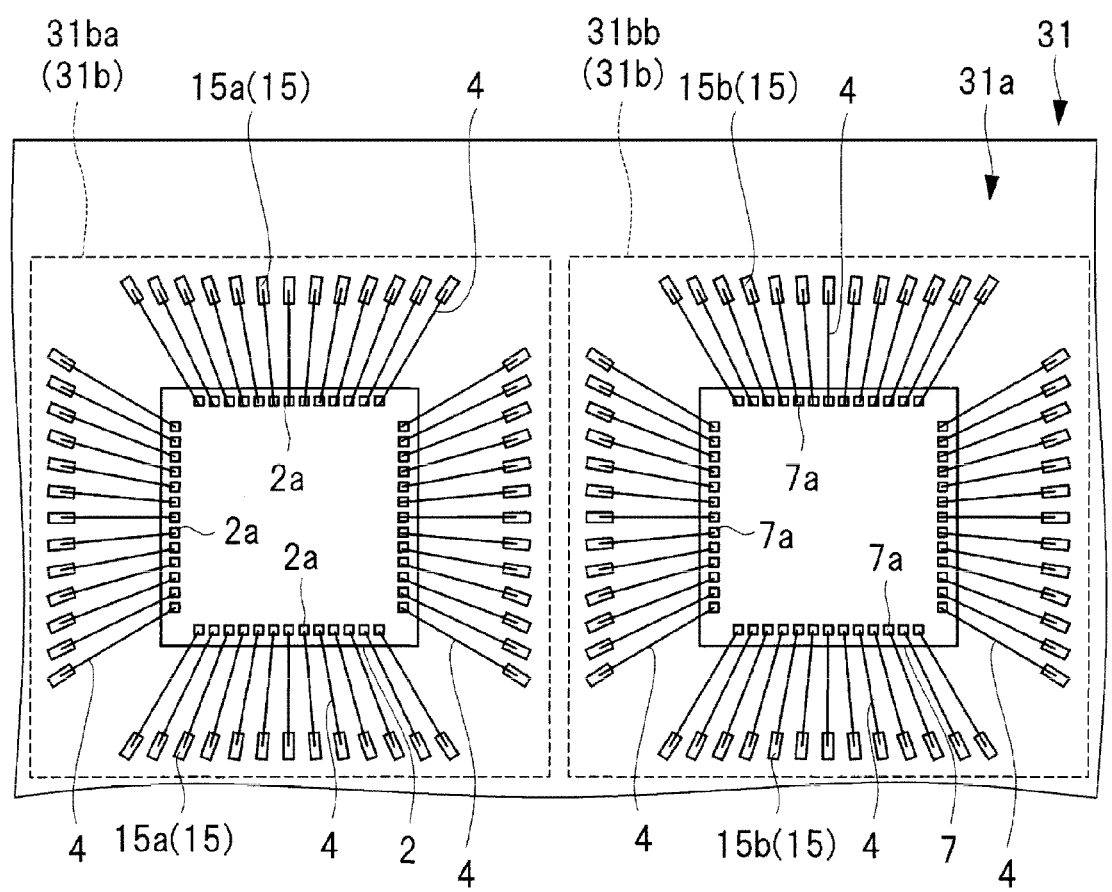
FIG. 19 is a partially enlarged plan view showing an example of the structure after the wire bonding shown in FIG. 14.

FIG. 12 is a partially enlarged cross-sectional view showing an example of the structure of a wiring substrate that is prepared in a substrate preparation process of assembling the semiconductor device in FIG. 1, FIG. 13 is a partially enlarged cross-sectional view showing an example of the structure after die bonding, FIG. 14 is a partially enlarged cross-sectional view showing an example of the structure after wire bonding in assembling the semiconductor device in FIG. 1, FIG. 15 is a partially enlarged plan view showing an example of the structure of the wiring substrate shown in FIG. 12. Furthermore, FIG. 16 is a plan view showing an example of the entire structure of the substrate after the die bonding shown in FIG. 13, FIG. 17 is a partially enlarged plan view showing an example of the structure after the die bonding shown in FIG. 13, FIG. 18 is a plan view showing an example of the entire structure of the substrate after the wire bonding shown in FIG. 14, and FIG. 19 is a partially enlarged plan view showing an example of the structure after the wire bonding shown in FIG. 14.

Figure 20:
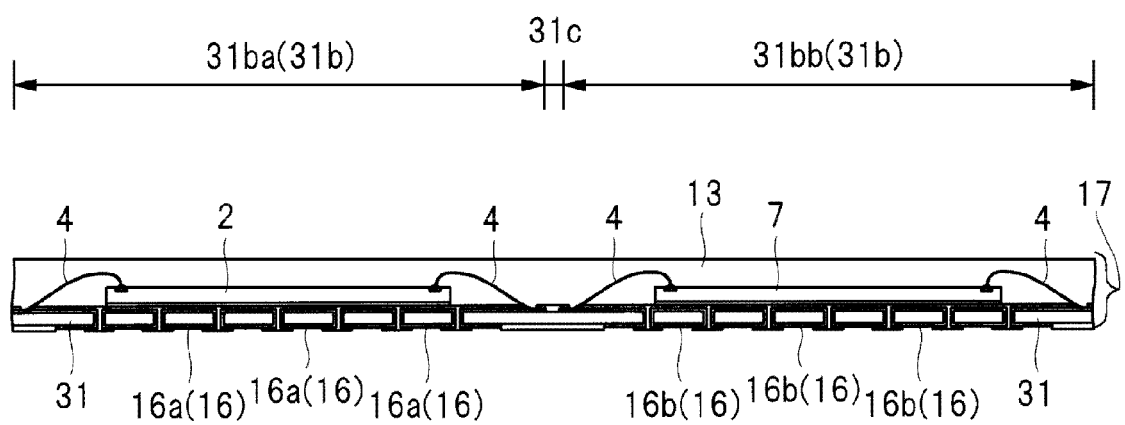
FIG. 20 is a partially enlarged cross-sectional view showing an example of the structure after molding in assembling the semiconductor device in FIG. 1.
Figure 21:
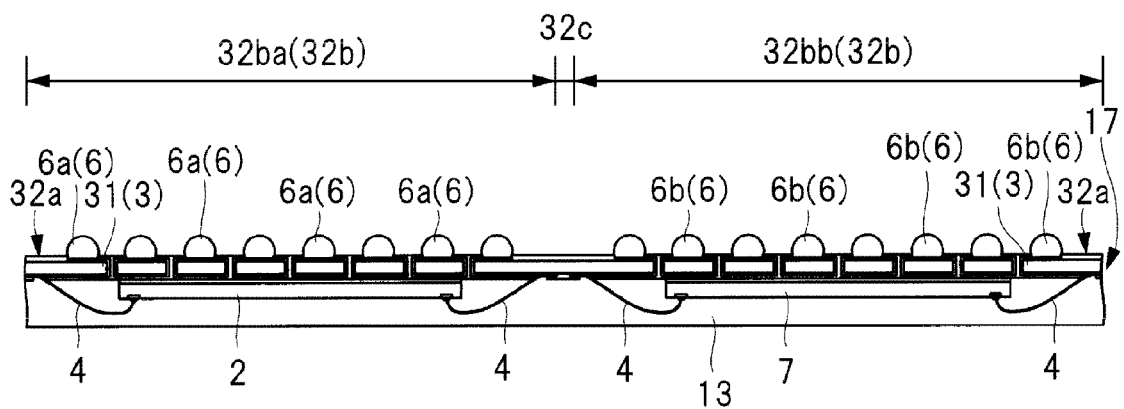
FIG. 21 is a partially enlarged cross-sectional view showing an example of the structure after ball soldering in assembling the semiconductor device in FIG. 1.
Figure 22:
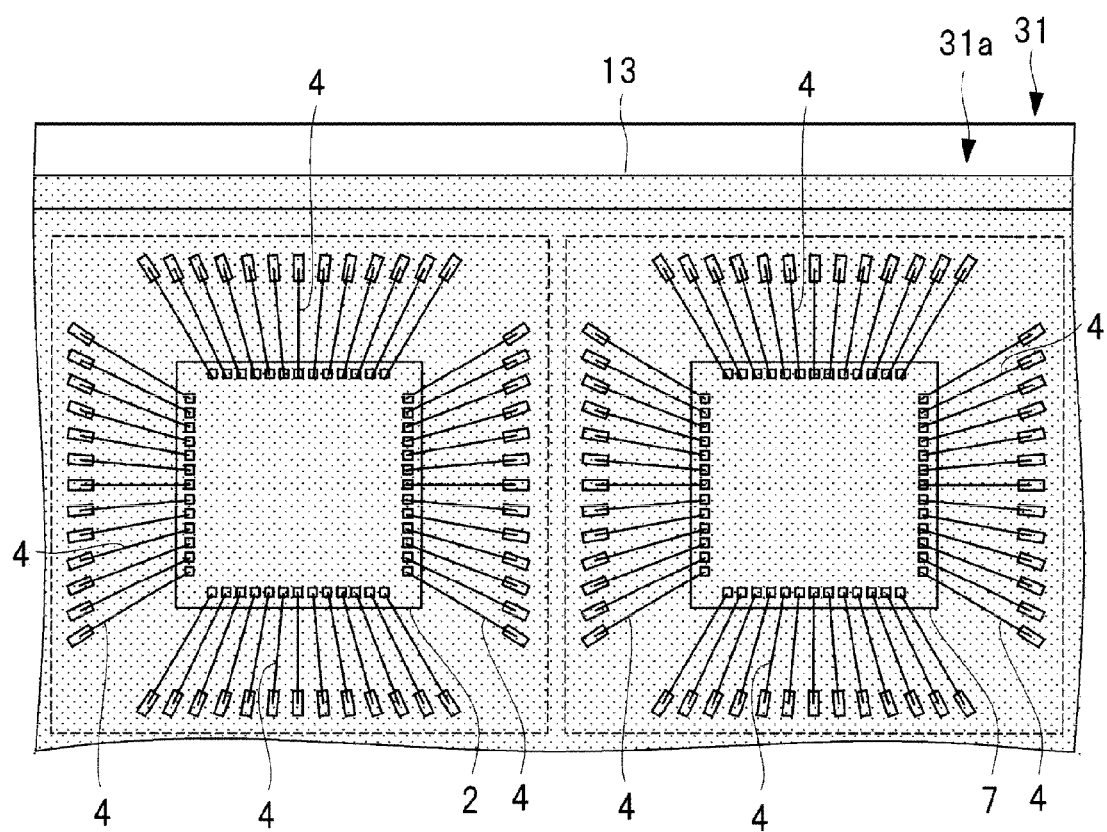
FIG. 22 is a partially enlarged plan view showing an example of the structure after the molding shown in FIG. 20 through the sealing body.
Figure 23:
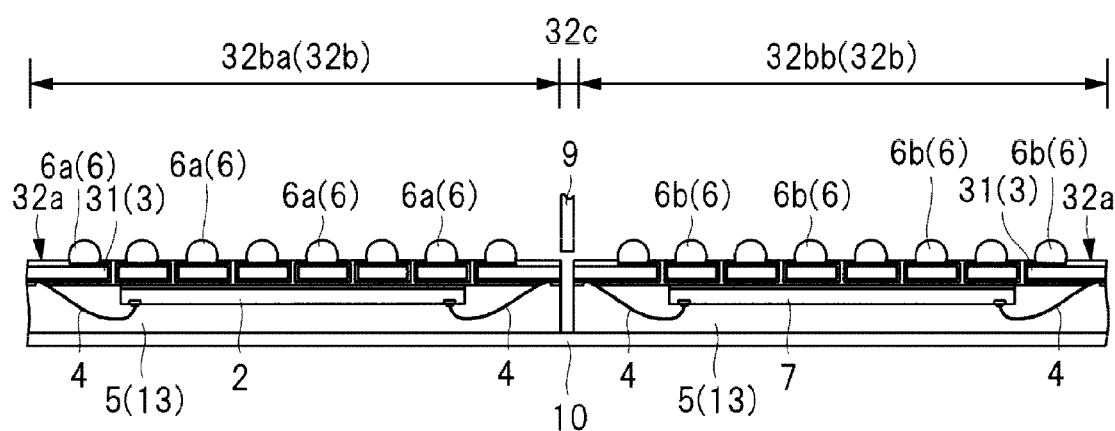
FIG. 23 is a partially enlarged cross-sectional view showing an example of the structure during singulation in assembling the semiconductor device in FIG. 1.
Figure 24:
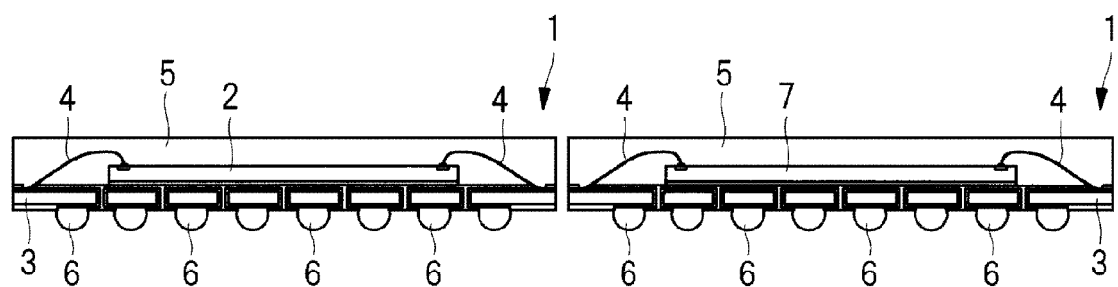
FIG. 24 is a partially enlarged cross-sectional view showing an example of the structure after the singulation in assembling the semiconductor device in FIG. 1.
Figure 25:
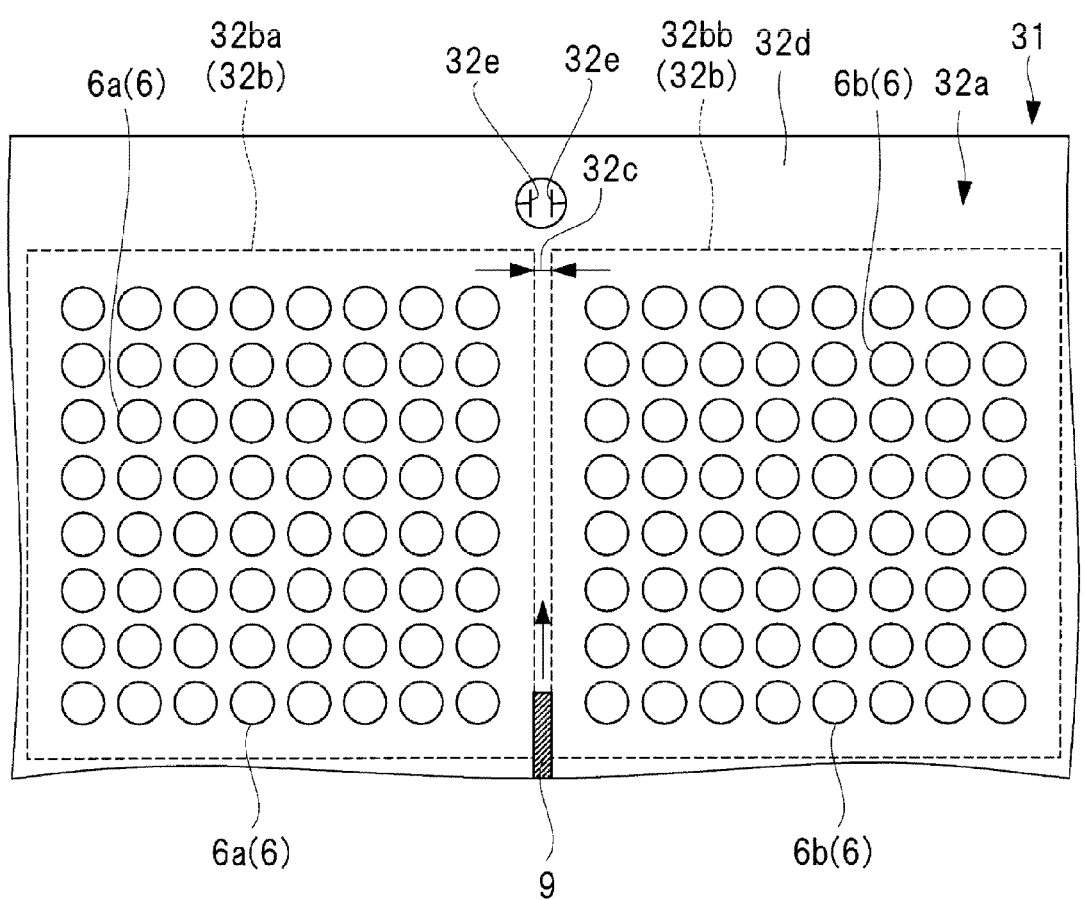
FIG. 25 is a partially enlarged plan view showing an example of the structure during the singulation shown in FIG. 23.

Furthermore, FIG. 20 is a partially enlarged cross-sectional view showing an example of the structure after molding in assembling the semiconductor device in FIG. 1, and FIG. 21 is a partially enlarged cross-sectional view showing an example of the structure after ball soldering in assembling the semiconductor device in FIG. 1. Moreover, FIG. 22 is a partially enlarged plan view showing an example of the structure after the molding shown in FIG. 20, through the sealing body, FIG. 23 is a partially enlarged cross-sectional view showing an example of the structure during the singulation in assembling the semiconductor device in FIG. 1, FIG. 24 is a partially enlarged cross-sectional view showing an example of the structure after the singulation in assembling the semiconductor device in FIG. 1, and FIG. 25 is a partially enlarged plan view showing an example of the structure during the singulation shown in FIG. 23.

Meanwhile, in FIGS. 12 to 14, FIG. 20, FIG. 21, FIG. 23 and FIG. 24, there are shown cross-sections in respective process steps in the same region (region extending across two semiconductor device regions 31ba (32ba) and 31bb (32bb)), in which, in spite of cross-sectional views, hatching is omitted for making the drawings intelligible.

2. Die Bonding Process

After preparing the wiring substrate (see FIGS. 12 and 15) 31 in Step S1 in FIG. 6, by performing the die bonding process, the semiconductor chip 2 is mounted and bonded over the semiconductor device region 31ba of the upper surface 31a of the wiring substrate 31 via the adhesive material 8 as shown in FIGS. 13, 16 and 17 (die bonding, chip mounting) (Step S2 in FIG. 6). Furthermore, the semiconductor chip 7 is mounted and bonded over the semiconductor device region 31bb of the wiring substrate 31 via the adhesive material 8.

Meanwhile, as the adhesive material 8, a paste-like adhesive material, a film-like adhesive material or the like can be used.

3. Wire Bonding Process

As shown in FIGS. 14, 18 and 19, by performing the wire bonding, each of electrodes 2a of the semiconductor chip 2 is electrically coupled to the coupling terminal 15 corresponding to this formed on the wiring substrate 31, via the wire 4 (Step S3 in FIG. 6). That is, a plurality of coupling terminals 15 in the semiconductor device region 31ba on the upper surface 31a of the wiring substrate 31 is electrically coupled, via the wires 4, to the electrodes 2a of the semiconductor chip 2 bonded on the semiconductor device region 31*ba* thereof. Similarly, the coupling terminals 15 are electrically coupled, via the wires 4, to the electrodes 7*a* of the semiconductor chip 7 bonded over the semiconductor device region 31*bb*.

4. Sealing Process

Next, as shown in FIGS. 20 and 22, a mold process (resin molding process, for example, transfer mold process) is performed. In the present process, there is formed a collective sealing body (sealing resin, sealing part, collective sealing part) 13, which seals a plurality of semiconductor chips 2 and 7 mounted over the wiring substrate (Step S4 in FIG. 6). That is, the mold process of the present embodiment adopts a MAP (Mold Array Package) system.

In the mold process in Step S4, there is performed collective sealing (collective molding) in which the semiconductor device regions 31*ba* and the semiconductor device regions 31*bb* on the upper surface 31*a* of the wiring substrate 31 are sealed collectively with a sealing resin. That is, over the whole of the semiconductor device regions 31*ba* and semiconductor device region 31*bb* on the upper surface 31*a* of the wiring substrate 31, the collective sealing body 13 is formed so as to cover the semiconductor chips 2 and 7 and the wire 4 in the semiconductor device regions 31*ba* and 31*bb*.

Consequently, the collective sealing body 13 is formed so as to cover the whole of the semiconductor device regions 31*ba* and 31*bb* on the upper surface 31*a* of the wiring substrate 31. The sealing resin forming the collective sealing body 13 is formed of a resin material such as a heat-curable resin material or the like, and can also contain a filler or the like. For example, the collective sealing body 13 can be formed by using an epoxy resin containing filler.

Meanwhile, by the wiring substrate 31 and the collective sealing body 13 (also including the semiconductor chips 2 and 7 and wire 4 sealed in the collective sealing body 13) over the wiring substrate 31, a sealing structure body (assembled body) 17 shown in FIG. 20 is formed. That is, the structure body in which collective sealing body 13 is formed over the multi-piece wiring substrate 31 is referred to as the sealing structure body 17.

Furthermore, by the resin sealing of the present mold process, on the upper surface 31*a* of the wiring substrate 31, the upside of the dicing region 31*c* thereof is also sealed with the collective sealing body 13.

5. Formation Process of External Terminal

As shown in FIG. 21, to the land (see FIG. 20) 16 on the lower surface 32*a* of the wiring substrate 31, the solder ball (external terminal, solder material, plating film) 6 is connected (bonded, formed) as an electroconductive member (Step S5 in FIG. 6). In the connection process of the solder ball 6 in Step S5, for example, the lower surface 32*a* of the wiring substrate 31 is made to face upward, a solder ball 6*a* is disposed (mounted) over each of the lands 16*a* in the semiconductor device region 32*ba* on the lower surface 32*a* of the wiring substrate 31 and is fixed temporarily with flux or the like, and in addition, a solder ball 6*b* is disposed (mounted) over each of the lands 16*b* in the semiconductor device region 32*bb* and is fixed temporarily with flux or the like.

Then, a reflow treatment (solder reflow treatment, heat treatment) is performed to fuse solder, and thus solder balls 6*a* and 6*b* can be bonded, respectively, with the lands 16*a* and 16*b* on the lower surface 32*a* of the wiring substrate 31. After that, the flux or the like adhering to the surface of the solder ball 6 can also be removed by a cleaning process, as necessary. Thus, the solder ball 6 as the external terminal (terminal for external coupling) of the semiconductor device is bonded (formed).

Meanwhile, in the present embodiment, the case where the solder ball 6 is bonded as the external terminal of the semiconductor device is explained, but the case is not limited to this. For example, an external terminal (bump electrode, solder bump) of the semiconductor device constituted of solder can also be formed by supply of solder over the land 16 by a printing method in place of the solder ball 6. In this case, by supplying solder over each of the lands 16*a* and 16*b* in the semiconductor device regions 32*ba* and 32*bb* over the lower surface 32*a* of the wiring substrate 31, and then performing a solder reflow treatment, the external terminal (bump electrode, solder bump) constituted of solder can be formed over each of the lands 16.

Furthermore, as to the material of the external terminal (here, solder ball 6) of the semiconductor device, lead-containing solder or lead-free solder that does not contain lead can be used, and the external terminal (bump electrode) of the semiconductor device can also be formed by plating.

Meanwhile, when solder is to be used, the use of lead-free solder not containing lead (Pb) substantially is preferable, which can also deal with the environmental pollution problem. Here, the lead-free solder means one in which the content of lead (Pb) is 0.1 wt % or less, and the content is defined as the standard of RoHS (Restriction of Hazardous Substances) instruction.

Next, as necessary, marking is performed to attach a mark such as a product number on the upper surface (surface) of the collective sealing body 13 (Step S6 in FIG. 6). In Step S6, for example, laser mark performing the marking by a laser is applicable, and an ink mark performing the marking with ink is also applicable.

6. Cutting Process

First, using FIGS. 23 to 25, the whole of the cutting process will be explained. That is, dicing (cutting, shaving) is carried out from the lower surface 32*a* side of the wiring substrate 31, along the dicing region (dicing line, boundary part of the respective semiconductor device regions) 32*c* between the semiconductor device region 32*ba* and the semiconductor device region 32*bb* on the lower surface 32*a* of the wiring substrate 31, by using the dicing blade (dicing saw, blade) 9 or the like. Consequently, the collective sealing body 13 formed over the dicing region and a part of the wiring substrate 31 (part corresponding to dicing region) are cut (separated) (Step S7 in FIG. 6).

For example, in Step S7, as shown in FIG. 23, the dicing process by the dicing blade 9 can be carried out in a state where the sticking of the upper surface of the collective sealing body 13 to a fixing tape (tape for fixing, dicing tape) 10 fixes the collective sealing body 13.

Consequently, the collective sealing body 13 and the wiring substrate 31 are cut along the dicing region 32*c*, and each of the semiconductor device regions is cut and separated into an individual (singulated) semiconductor device (BGA 1) (singulation). That is, the collective sealing body 13 and the wiring substrate 31 are cut and separated into the respective semiconductor device regions, and the BGA 1 is formed from each of the semiconductor device regions.

The BGA 1 as shown in FIGS. 1 to 5 can be manufactured by cutting/singulation as described above.

Next, details of the cutting process will be explained.

In the cutting process (dicing process) of the wiring substrate 31, each of dicing regions 32*c* is specified on the basis of the target mark (target pattern) 32*e* shown in FIG. 9, and after that, the wiring substrate 31 is cut along the dicing region 32c. Here, in the present cutting process, the wiring substrate 31 is cut using the dicing blade (rotatable cutting blade) 9 shown in FIG. 25.

First, a pair of target marks 32e facing each other shown in FIG. 8 are checked with an image recognition part (such as a camera), and the dicing region 32c is identified on the basis of the checked target marks 32e. After that, the wiring substrate 31 is cut on the basis of the derived dicing region (dicing line) 32c. At this time, by using the dicing blade (rotatable cutting blade) 9 shown in FIG. 25, the dicing blade 9 is run from one target mark 32e toward another target mark 32e. That is, by running the dicing blade 9 along the dicing region 32c, the wiring substrate 31 is cut.

Here, the dicing blade 9 has a width of the dicing region 32c (first width) that is the blade width 32h shown in FIG. 9.

"Run the dicing blade 9" referred to in the present embodiment means that, by fixing the dicing blade (rotatable cutting blade) 9 in a prescribed position and moving a stage of a dicing device not illustrated for supporting (fixing) the wiring substrate 31, the rotatable cutting blade is inserted into the wiring substrate 31 and thus the cutting of the wiring substrate 31 is performed. In this case, in the present embodiment, since semiconductor chips mounted over the wiring substrate 31 are sealed collectively, not only the wiring substrate 31, but also a part to be removed overlapping the dicing region 32c of the wiring substrate within the collective sealing body 13 is also cut (removed).

Meanwhile, in the present embodiment, all the target marks 32e of the wiring substrate 31 are checked and the dicing is performed after specifying respective dicing regions 32c, but the method is not limited to this. It may also be possible to specify some parts of dicing regions 32c and then to specify the subsequent dicing region 32c after cutting the dicing regions 32c.

Next, problems found by the present inventors will be explained in detail.

Figure 34:
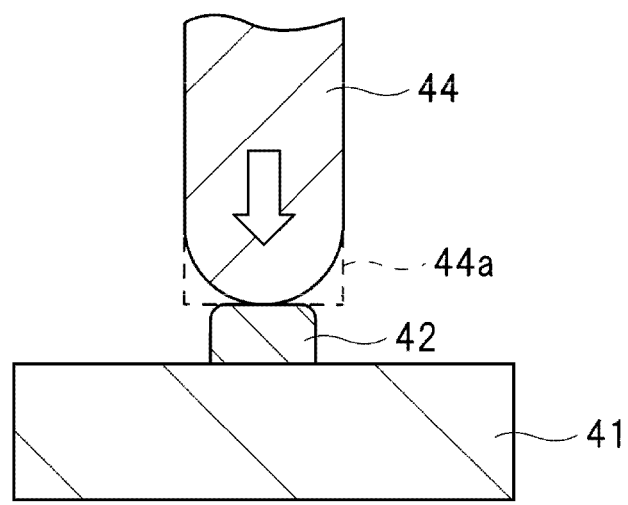
FIG. 34 is a partial cross-sectional view showing a structure in cutting a substrate according to a Comparative Example.

By repetition of the dicing process in the cutting process, an edge 44a of a dicing blade 44 is worn away (part shown by dotted line) as shown in FIG. 34. In addition, when the dicing blade 44 is worn away, the edge 44a of the dicing blade 44 makes contact with the peripheral part of the target mark 42 after the contact of the central part of the dicing blade 44 with the central part of a target mark 42 formed on a wiring substrate 41.

Figure 35:
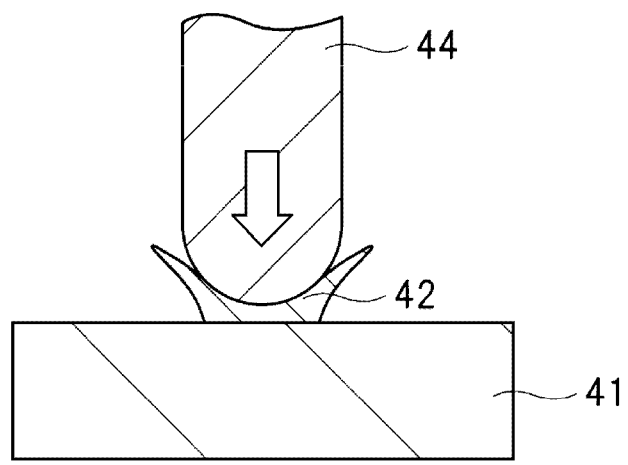
FIG. 35 is a partial cross-sectional view showing a structure in cutting the substrate according to a Comparative Example.

Consequently, as shown in FIG. 35, a part of the target mark 42 is driven out to the circumference thereof. In addition, as shown in FIG. 36, when the dicing blade 44 goes furthermore into the wiring substrate 41, a part of the target mark 42 having been driven out is separated from the target mark 42 to thereby become a foreign substance (metal chip, metal piece) 43. After that, the generated foreign material 43 disperses, or adheres to the surface of the dicing blade 44.

Meanwhile, also in the case where the foreign substance 43 adheres to the surface of the dicing blade 44, the foreign substance 43 might peel off from the surface of the dicing blade 44 when the dicing blade 44 is positioned between device areas adjacent to each other (that is, in dicing region 32c). Furthermore, when the foreign substance 43 extends over between electrodes or between external terminals in the respective device areas (semiconductor device region), a short circuit is generated. Moreover, when the foreign substance 43 is a metal chip formed of copper (Cu) as is the case for the present embodiment, the metal foreign substance (foreign substance 43) adhering between electrodes or external terminals might not be removed in a subsequent cleaning process.

However, since no target mark 42 is provided over the dicing region 32c of the wiring substrate 31 and the extension line L0 thereof in the method of manufacturing a semiconductor device of the present embodiment, when cutting is performed using the dicing blade 9 in the cutting process, the dicing blade 9 never passes over the target mark 32e.

That is, since the dicing blade 9 never cuts the target mark 32e that is not covered with the insulating film or the like in the cutting process, even if the edge part of the dicing blade 9 is worn away, the target mark 32e (electroconductive member) is never driven out, and the generation of the foreign material 43 by the electroconductive member as shown in FIG. 36 can be suppressed.

Accordingly, since the generation of a short circuit or the like can be suppressed in assembling the BGA 1, the enhancement of reliability in assembling the BGA (semiconductor device) 1 can be achieved.

Furthermore, as shown in FIG. 9, the target mark 32e is provided between the imaginary extension line L1 of the outermost peripheral land row 16c and the imaginary extension line L2 of the outermost peripheral land row 16d. Consequently, an image recognition region when the target mark 32e is checked can be made narrow, and as the result, the image processing when the target mark 32e is to be recognized can be performed with high accuracy (high resolution).

That is, if the target mark 32e is separated too much from the semiconductor device region (or dicing region 32c), the image recognition region when the target mark 32e is to be checked is required to be wide, which makes recognition accuracy (resolution) of an image processing low. However, in the method of manufacturing of a semiconductor device of the present embodiment, the image processing can be performed with high recognition accuracy (high resolution) as described above.

Accordingly, the positioning of the wiring substrate 31 and the running of the dicing blade 9 can be performed with high accuracy.

In addition, as shown in FIG. 9, the first pattern 32ea and second pattern 32eb of the target mark 32e have intersecting parts 32eac and 32ebc, respectively, and thus when the target mark 32e is recognized in the cutting process, corner parts of intersecting parts 32eac and 32ebc can be recognized.

That is, since it becomes possible to recognize the intersecting point of an X direction and a Y direction intersecting it in the first pattern 32ea and the second pattern 32eb, the determination of the θ displacement of the wiring substrate 31 and the identification of the position (line, dicing line) to be cut with the dicing blade 9 can be performed with higher accuracy.

Furthermore, in the target mark 32e, since the first pattern 32ea and the second pattern 32eb are separated from each other and the separation distance is larger than the width of the dicing blade 9 (blade width 32h), and thus in the cutting, the dicing blade 9 can be passed through between the first pattern 32ea and the second pattern 32eb. That is, if displacement of the dicing blade 9 is not generated, the dicing blade 9 makes contact with neither the first pattern 32ea nor the second pattern 32eb.

Consequently, failure analysis after the cutting can be easily performed. That is, a worker can easily check with eyes whether or not the dicing blade 9 is running according to the design between the first pattern 32ea and the second pattern 32eb which are two patterns facing each other.

As the result, in the cutting process, it becomes possible to respond to the generation of an abnormal value or the like by giving quick feedback to the work.

<Modification>

Hereinbefore, although the invention achieved by the present inventors has been explained specifically on the basis of the embodiment of the present invention, it is needless to say that the present invention is not limited to the embodiment described until now but may be changed variously in the range that does not deviate from the purport thereof.

(Modification 1)

In the above-described embodiment, as the method of manufacturing a semiconductor device, the assembling adopting the MAP system has been explained, but the assembling of the semiconductor device is not limited to the MAP system. There may also be adopted an assembling of an individual molding system, in which an individual semiconductor device region in the wiring substrate is resin-molded individually and after that, the individual semiconductor device is acquired by cutting through dicing.

(Modification 2)

In the above-described embodiment, as an example of the semiconductor device, the case of BGA having the solder ball 6 has been explained, but the semiconductor device is not limited to the case of BGA. The above-mentioned semiconductor device may be of LGA (Land Grid Array), in which an electroconductive member such as a plating film, instead of an electroconductive member of a protruding shape such as the solder ball 6, is formed on the surface of the land or the surface of the land is not covered with an electroconductive member.

(Modification 3)

In the above-described embodiment, the case where the wiring substrate 31 prepared in the substrate preparation process is the substrate in which a feeder line for plating is previously removed by etching or the like in the dicing region 32c thereof has been explained, but after preparing a wiring substrate of a state where the feeder line for plating is provided in the dicing region 32c, the feeder line for plating in the dicing region 32c may be removed by etching or the like.

(Modification 4)

Figure 26:
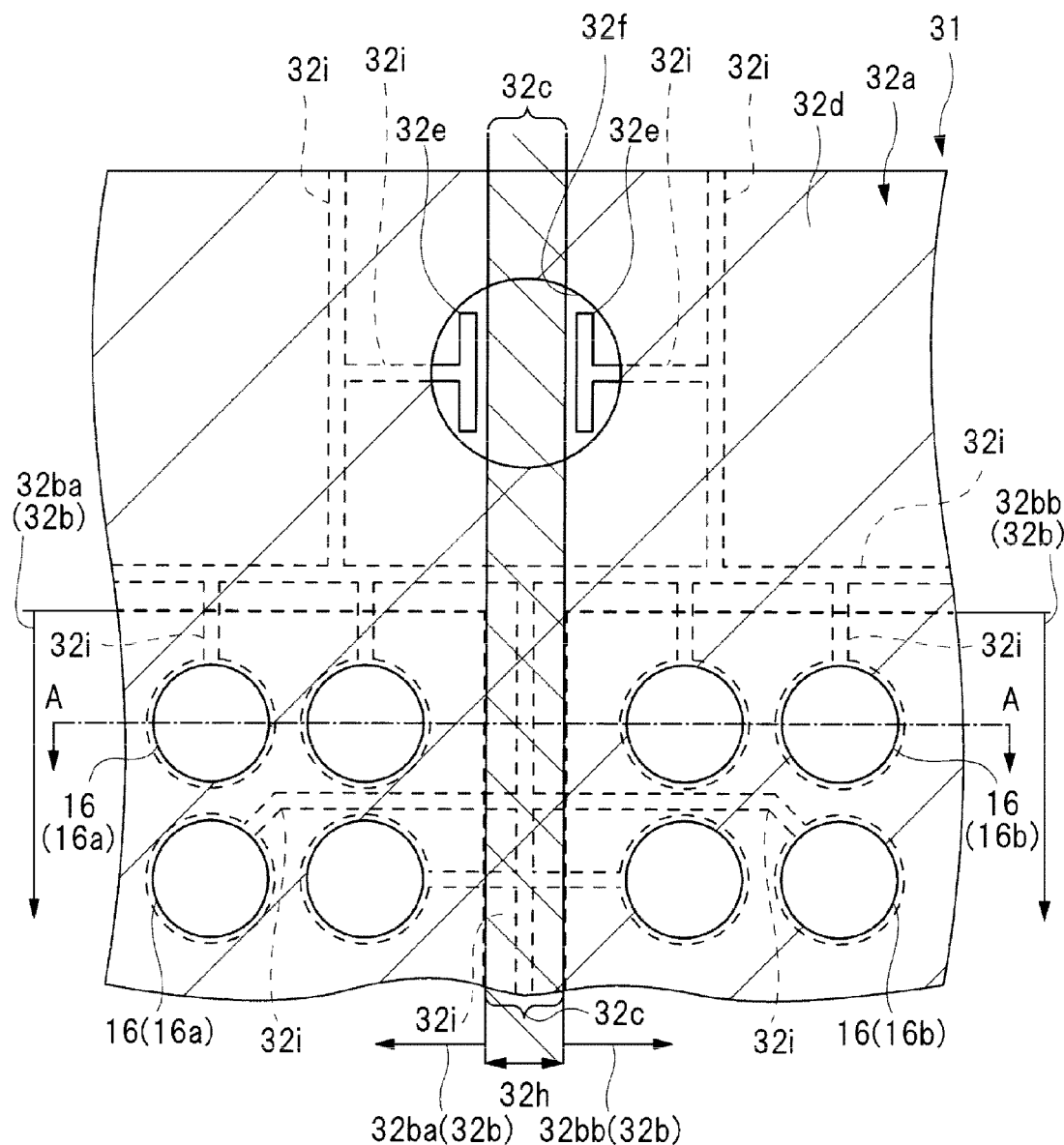
FIG. 26 is a partially enlarged plan view showing an example of the substrate structure (no etching-back) of a mounting surface side during the singulation shown in FIG. 20.
Figure 27:
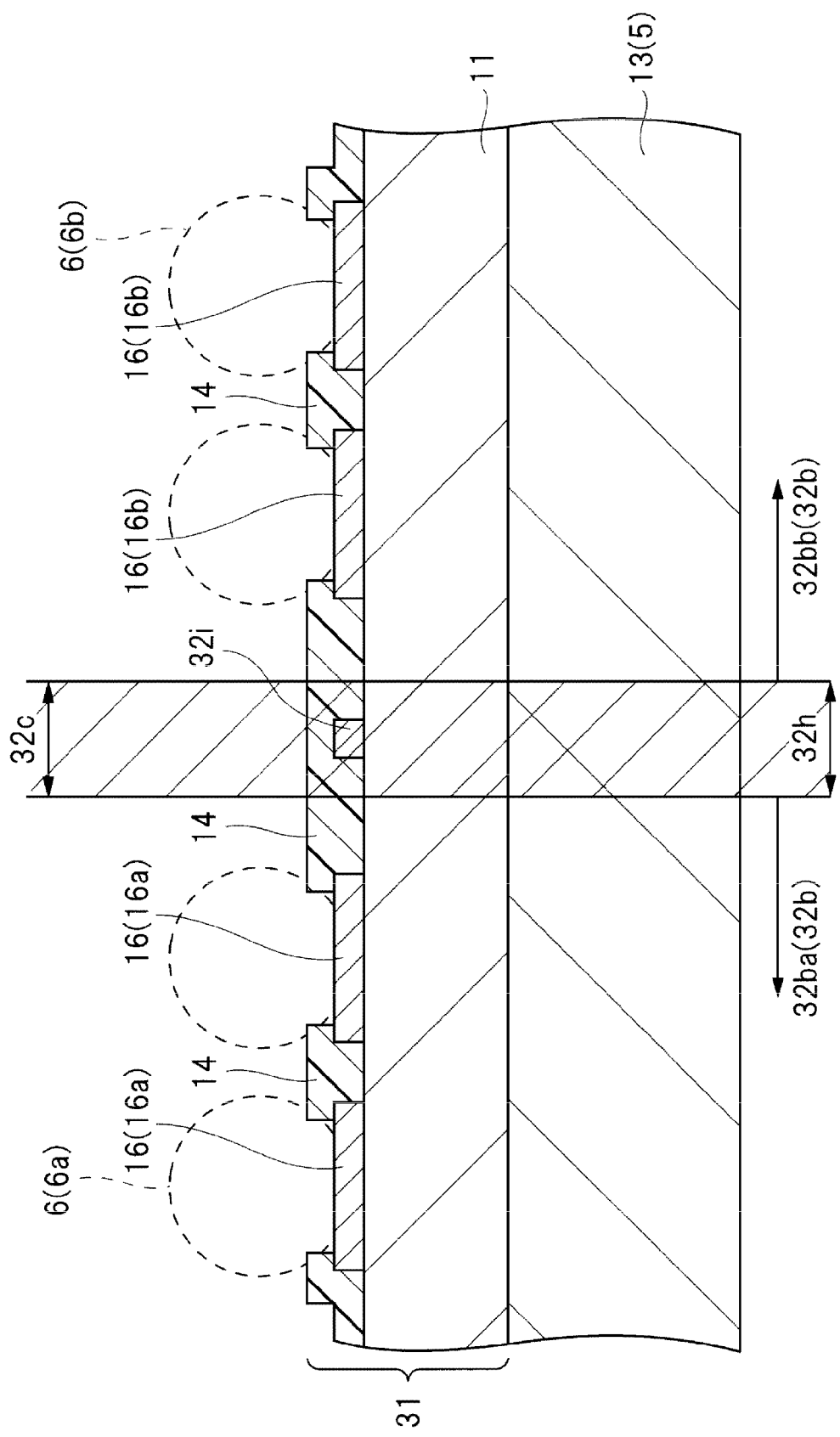
FIG. 27 is a cross-sectional view showing an example of a structure after cutting along an A-A line in FIG. 26.

FIG. 26 is a partially enlarged plan view showing an example of the substrate structure (no etching-back) of a mounting surface side during the singulation shown in FIG. 20, and FIG. 27 is a cross-sectional view showing an example of a structure cut along the A-A line in FIG. 26.

In the above-described embodiment, there has been explained the case where the wiring substrate 31 prepared in the substrate preparation process is a substrate in which a feeder line for plating is previously removed in the dicing region 32c thereof, but, as shown in FIGS. 26 and 27, the feeder line 32i for plating provided in the dicing region 32c may remain without the removal.

However, in the case, it is necessary to cover the feeder line 32i for plating provided in the dicing region 32c with, for example, the solder resist layer (insulating film, protective film) 14. Therefore, unlike in the above-described embodiment, the solder resist layer (insulating film, protective film) 14 exists not only over the respective device areas (the respective semiconductor device regions) but also over the dicing region 32c as shown in FIG. 27.

In addition, since the feeder line 32i for plating provided in the dicing region 32c is covered with the solder resist layer 14, that is, is held down with the solder resist layer 14, even if the wiring substrate 31 is cut through the use of the dicing blade 9 with a worn away edge in the cutting process, the feeder line is not put into a driven-out state, and, as the result, the foreign substance 43 as shown in FIG. 36 is not generated.

(Modification 5)

Figure 28:
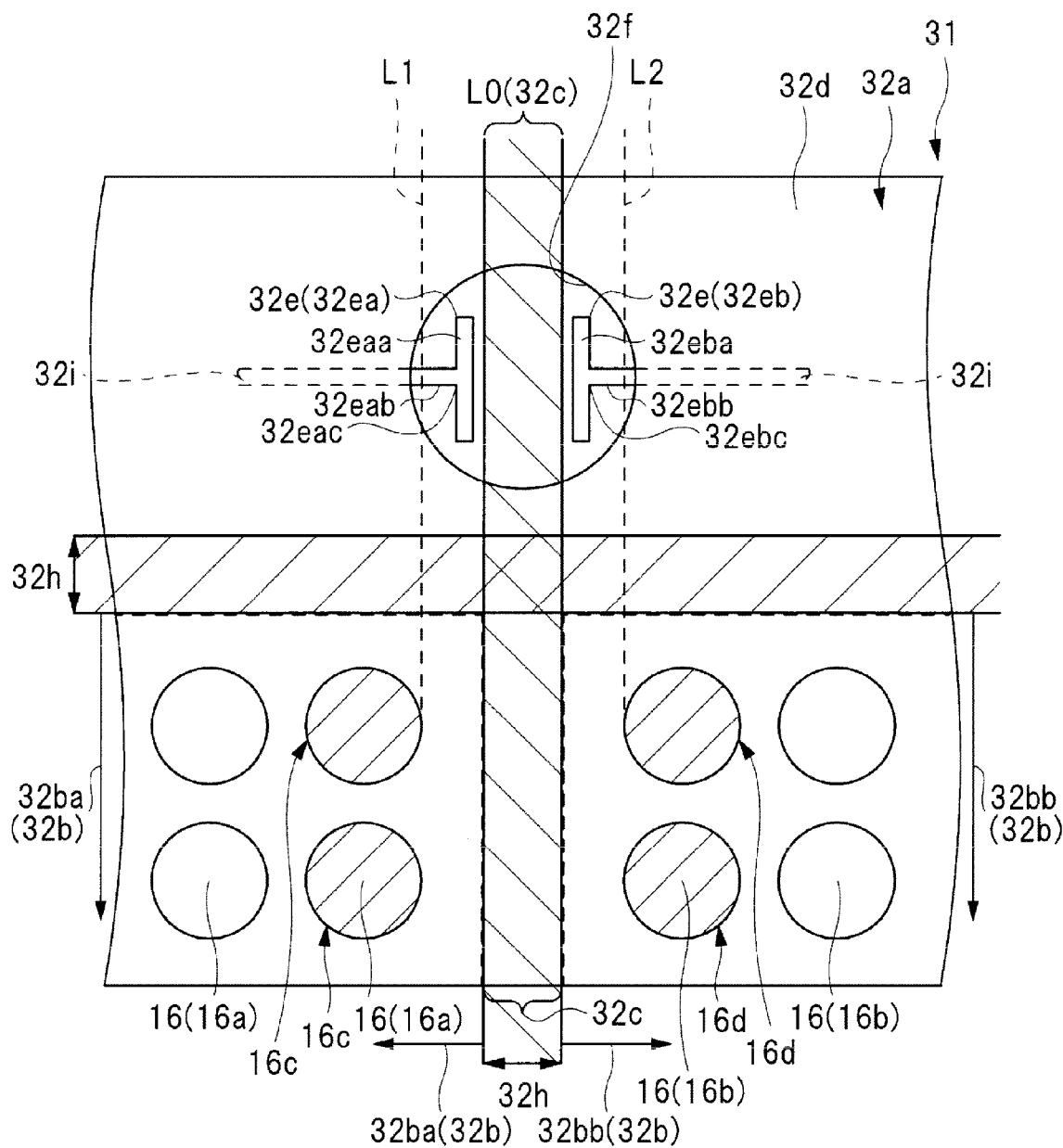
FIG. 28 is a partially enlarged plan view showing a structure of the mounting surface side of a wiring substrate in a Modification 5.

FIG. 28 is a partially enlarged plan view showing a structure of the mounting surface side of a wiring substrate in a Modification 5.

In the above-described embodiment, there has been explained the case where the target mark 32e is not provided on the extension line L0 of the dicing region 32c but is provided, in a plan view, between the extension line L0 of the dicing region 32c and the imaginary extension line L1 of the outermost peripheral land row 16c, and between the extension line L0 of the dicing region 32c and the imaginary extension line L2 of the outermost peripheral land row 16d.

However, it suffices that, between the extension line L0 of the dicing region 32c and the imaginary extension line L1 of the outermost peripheral land row 16c, and between the extension line L0 and the imaginary extension line L2, at least a main part necessary for recognizing the pattern constituting the target mark 32e has only to be disposed.

For example, when the feeder line 32i for plating is coupled to the target mark 32e, each of a part of the second extension part 32eab intersecting with the first extension part (main part) 32eaa and a part of the second extension part 32ebb intersecting with the first extension part (main part) 32eba in the target mark 32e as shown in FIG. 28 may extend in the direction going away from the extension line L0, across the imaginary extension lines L1 and L2.

(Modification 6)

FIGS. 29 to 33 are partially enlarged plan views showing the structure of the target mark in a Modification 6.

Figure 29:
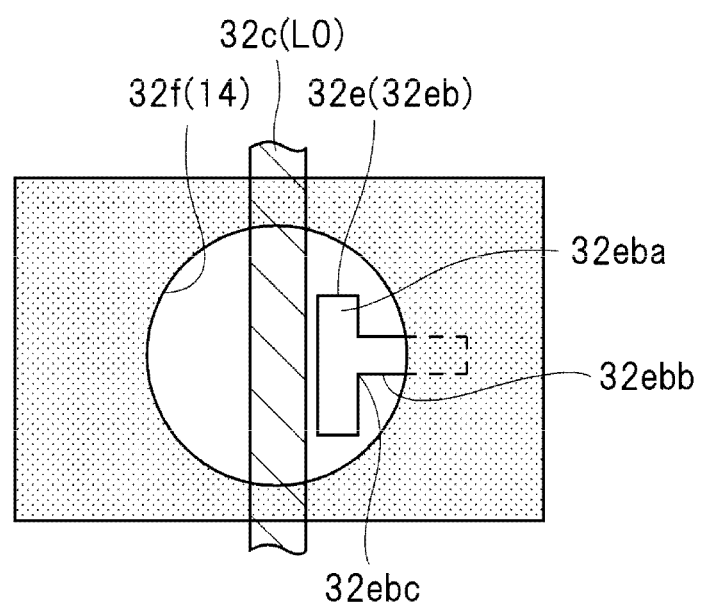
FIG. 29 is a partially enlarged plan view showing a structure of a target mark in a Modification 6.

In the above-described embodiment, each of the first pattern 32ea and the second pattern 32eb of the target mark 32e is disposed separately on both sides of the extension line L0 of the dicing region 32c, but in the example shown in FIG. 29, each of the first pattern 32ea and the second pattern 32eb is provided only on one side of the extension line L0 of the dicing region 32c.

For example, in the example shown in FIG. 29, the second pattern 32eb of the target mark 32e is provided between the extension line L0 of the dicing region 32c and the imaginary extension line L2 of the outermost peripheral land row 16d in FIG. 28, and the second pattern 32eb includes the first extension part 32eba and the second extension part 32ebb.

Accordingly, the second pattern 32eb is provided with the intersecting part 32ebc.

Even in the case where the target mark 32e is provided only on one side of the extension line L0 of the dicing region 32c, the target mark 32e can be recognized because of having the intersecting part 32ebc.

Figure 30:
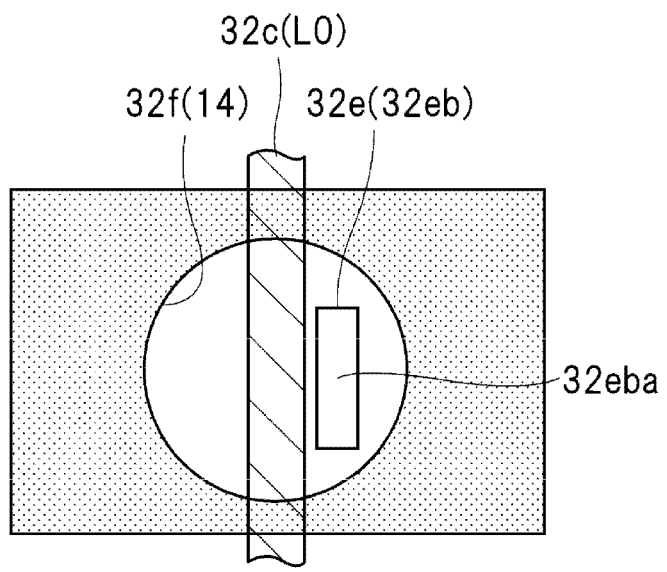
FIG. 30 is a partially enlarged plan view showing another structure of the target mark in a Modification 6.

The example shown in FIG. 30 corresponds to the case where the target mark 32e is only the first extension part 32eba along the same direction as that of the extension line L0 of the dicing region 32c. That is, the example corresponds to the case where the target mark 32e is a case of the pattern of the first extension part 32eba extending only in one direction.

In the case, it is preferable that all the peripheral parts (side) of the first extension part 32eba are disposed in the region of the opening 32f of the solder resist layer 14. The recognition of the straight part of the side or the corner makes the recognition of the target mark 32e possible.

Meanwhile, in the case of the pattern in which all the peripheral parts (side) of the target mark 32e are disposed in the region of the opening 32f of the solder resist layer 14, the plating is to be formed by an electroless plating system.

Figure 31:
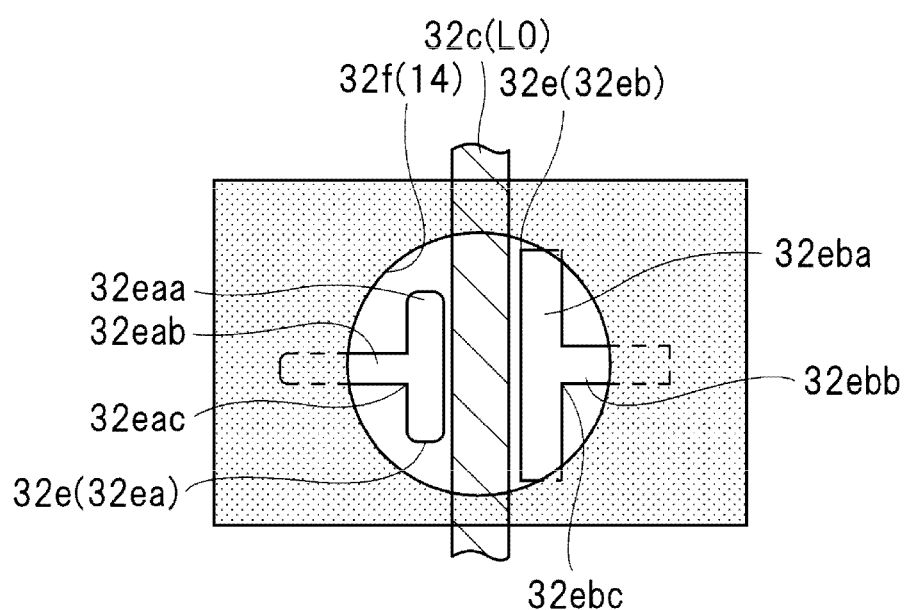
FIG. 31 is a partially enlarged plan view showing another structure of the target mark in a Modification 6.

The example shown in FIG. 31 corresponds to the case where the target mark 32e is provided on both sides of the extension line L0 of the dicing region 32c and is constituted of the first pattern 32ea provided on one side and the second pattern 32eb provided on the other side, in which sizes of the patterns are different from each other.

That is, the size of the first pattern 32ea and the size of the second pattern 32eb may be different from each other. In the example shown in FIG. 31, both the first pattern 32ea and the second pattern 32eb are provided with intersecting parts 32eac and 32ebc, respectively, and by recognition of each long side of the first extension parts 32eaa and 32eba or the intersecting parts 32eac and 32ebc, it is possible not only to recognize the target mark 32e but also to specify the dicing line with higher accuracy.

Figure 32:
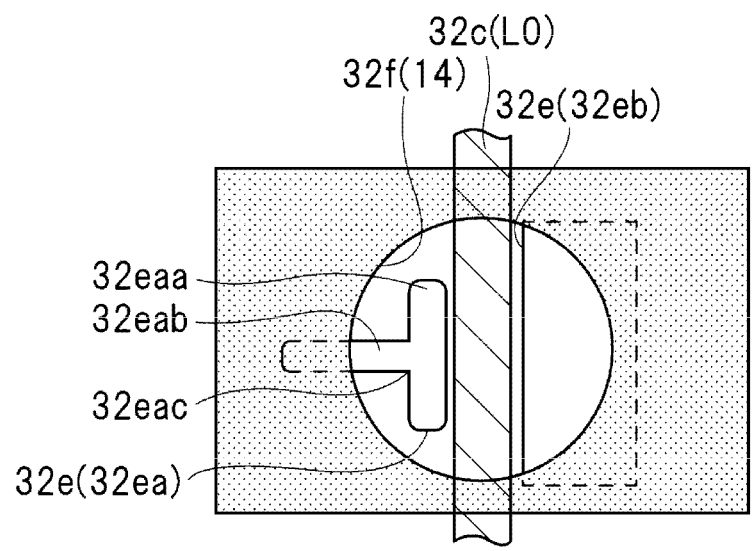
FIG. 32 is a partially enlarged plan view showing another structure of the target mark in a Modification 6.

The example shown in FIG. 32 corresponds to the case where the first pattern 32ea, in the first pattern 32ea and the second pattern 32eb of the target mark 32e, is provided with the intersecting part 32eac, and furthermore, the second pattern 32eb is larger than the first pattern 32ea, and only one side of the second pattern 32eb is disposed in the opening 32f of the solder resist layer 14.

Also in the case of the target mark 32e, by recognition or the like of the straight part of one side (long side) of the second pattern 32eb and the intersecting part 32eac of the first pattern 32ea, the target mark 32e can be recognized with high accuracy.

Figure 33:
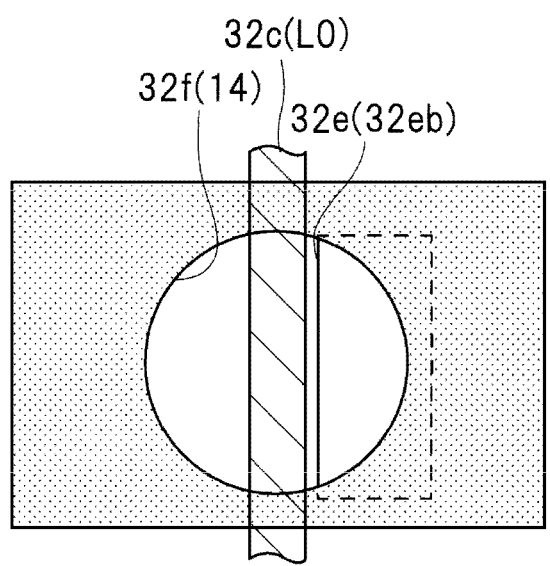
FIG. 33 is a partially enlarged plan view showing another structure of the target mark in a Modification 6.

The example shown in FIG. 33 corresponds to the case where only the second pattern 32eb is provided as the target mark 32e and only one side (long side) of the second pattern 32eb is exposed to the opening 32f of the solder resist layer 14.

Also in the case, by recognition of the straight part of one side (long side) of the second pattern 32eb, the target mark 32e can be reliably recognized.

(Modification 7)

Furthermore, each of modifications can be combined and applied in the range not deviating from the purport of the technical idea explained in the above-described embodiment.

What is claimed is:

1. A method of manufacturing a semiconductor device comprising the steps of:
   (a) providing a wiring substrate including:
      an upper surface,
      a lower surface opposite to the upper surface,
      a first device region provided on the lower surface,
      a second device region provided on the lower surface and also provided next to the first device region in plan view,
      a dicing region provided between the first device region and the second device region in plan view and at which cutting of the wiring substrate is to be performed by a rotating cutting blade,
      a peripheral region provided on the lower surface and also provided around the first device region, the second device region and the dicing region in plan view,
      a target mark provided in the peripheral region,
      a first plurality of outermost lands provided in the first device region in plan view and also arranged along the dicing region in the plan view,
      a second plurality of outermost lands provided in the second device region in plan view and also arranged along the dicing region on plan view, and
      an insulating film formed over the lower surface such that the insulating film exposes the target mark, the first plurality of outermost lands provided in the first device region and the second plurality of outermost lands provided in the second device region,
   wherein, in plan view, the target mark is provided between an imaginary extension line of a row comprised of the first plurality of outermost lands provided in the first device region and an imaginary extension line of a row comprised of the second plurality of outermost lands provided in the second device region, but not provided on an imaginary extension line of the dicing region,
   wherein the target mark includes a first pattern comprised of metal, and a second pattern comprised of metal and also spaced apart from the first pattern by a region located between the first pattern and the second pattern in plan view, and that, prior to cutting, is free of metal,
   wherein each of the first pattern and the second pattern is comprised of a first extension part extending along an extension direction of the dicing region, and a second extension part that intersects with the first extension part, and
   wherein, in plan view, a size of the first pattern and a size of the second pattern are different from each other;
   (b) after the step (a), mounting a first semiconductor chip and a second semiconductor chip on the upper surface of the wiring substrate;
   (c) after the step (b), sealing the upper surface of the wiring substrate, the first semiconductor chip and the second semiconductor chip with resin;
   (d) after the step (c), forming a plurality of first external terminals and a plurality of second external terminals, respectively, on the first plurality of outermost lands provided in the first device region and the second plurality of outermost lands provided on the second device region; and
   (e) after the step (d), recognizing an intersecting part of the first extension part of the first pattern and the second extension part of the first pattern and an intersecting part of the first extension part of the second pattern and the second extension part of the second pattern, and cutting a part of the wiring substrate, that includes a region located between the first pattern and the second pattern in plan view and the dicing region, with a rotating cutting blade so as not to contact the rotating cutting blade with the target mark including the first pattern and the second pattern.

2. The method of manufacturing a semiconductor device according to claim 1,
   wherein an insulating film is formed over the upper surface of the wiring substrate;
   wherein a plating film is formed on each of surfaces of the first plurality of outermost lands and the second plurality of outermost lands;
   wherein, in the step of forming the plating film, the plating film is formed by using a feeder line formed in the dicing region; and
   wherein, after forming the plating film, the feeder line formed in the dicing region of the wiring substrate and the insulating film covering the feeder line are removed.

3. The method of manufacturing a semiconductor device according to claim 1,
   wherein, in the dicing region of the wiring substrate, a feeder line for plating to be electrically connected to each of the first plurality of outermost lands and each
of the second plurality of outermost lands is provided;
and wherein the feeder line is covered with the insulating film.

4. The method of manufacturing a semiconductor device according to claim 1,
wherein the second extension part is perpendicular to the first extension part.

5. A method of manufacturing a semiconductor device comprising the steps of:
(a) providing a wiring substrate including:
an upper surface,
a lower surface opposite to the upper surface,
a first device region provided on the lower surface,
a second device region provided on the lower surface and also provided next to the first device region in plan view,
a dicing region provided between the first device region and the second device region in plan view and at which cutting of the wiring substrate is to be performed by a rotating cutting blade,
a peripheral region provided on the lower surface and also provided around the first device region, the second device region and the dicing region in plan view,
a target mark provided in the peripheral region,
a first plurality of outermost lands provided in the first device region in plan view and also arranged along the dicing region in plan view,
a second plurality of outermost lands provided in the second device region in plan view and also arranged along the dicing region in plan view, and
an insulating film formed over the lower surface such that the insulating film exposes the target mark, the first plurality of outermost lands provided in the first device region and the second plurality of outermost lands provided in the second device region,
wherein, in plan view, the target mark is provided between an imaginary extension line of a row comprised of the first plurality of outermost lands provided in the first device region and an imaginary extension line of a row comprised of the second plurality of outermost lands provided in the second device region, but not provided on an imaginary extension line of the dicing region,
wherein the target mark includes a first pattern comprised of metal, and a second pattern comprised of metal and also spaced apart from the first pattern by a region located between the first pattern and the second pattern in plan view, and that, prior to cutting, is free of metal, and
wherein, in plan view, a size of the first pattern and a size of the second pattern are different from each other;

(b) after the step (a), mounting a first semiconductor chip and a second semiconductor chip on the upper surface of the wiring substrate;
(c) after the step (b), sealing the upper surface of the wiring substrate, the first semiconductor chip and the second semiconductor chip with resin;
(d) after the step (c), forming a plurality of first external terminals and a plurality of second external terminals, respectively, on the first plurality of outermost lands provided in the first device region and the second plurality of outermost lands provided in the second device region; and
(e) after the step (d), recognizing the target mark, and cutting a part of the wiring substrate, that includes the region located between the first pattern and the second pattern in plan view and the dicing region, with the rotating cutting blade so as not to contact the rotating cutting blade with the target mark including the first pattern and the second pattern.

6. The method of manufacturing a semiconductor device according to claim 5,
wherein an insulating film is formed over the upper surface of the wiring substrate;
wherein a plating film is formed on each of surfaces of the first plurality of outermost lands and the second plurality of outermost lands;
wherein, in the step of forming the plating film, the plating film is formed by using a feeder line formed in the dicing region; and
wherein, after forming the plating film, the feeder line formed in the dicing region of the wiring substrate and the insulating film covering the feeder line are removed.

7. The method of manufacturing a semiconductor device according to claim 5,
wherein, in the dicing region of the wiring substrate, a feeder line for plating to be electrically connected to each of the first plurality of outermost lands and each of the second plurality of outermost lands is provided; and
wherein the feeder line is covered with the insulating film.

8. The method of manufacturing a semiconductor device according to claim 5,
wherein each of the first pattern and the second pattern is comprised of a first extension part extending along an extension direction of the dicing region, and a second extension part that intersects with the first extension part, and
wherein the second extension part is perpendicular to the first extension part.

* * * * *